United States Patent
Nguyen

(10) Patent No.: US 6,713,938 B2
(45) Date of Patent: Mar. 30, 2004

(54) METHOD AND APPARATUS FOR FILTERING SIGNALS UTILIZING A VIBRATING MICROMECHANICAL RESONATOR

(75) Inventor: Clark T.-C. Nguyen, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 09/839,436

(22) Filed: Apr. 20, 2001

(65) Prior Publication Data

US 2002/0021054 A1 Feb. 21, 2002

Related U.S. Application Data

(63) Continuation-in-part of application No. 09/482,670, filed on Jan. 13, 2000, now Pat. No. 6,249,073.
(60) Provisional application No. 60/115,882, filed on Jan. 14, 1999, and provisional application No. 60/199,063, filed on Apr. 20, 2000.

(51) Int. Cl.$^7$ ............................................... H02N 2/00
(52) U.S. Cl. ..................... 310/309; 333/186; 333/197; 331/116 M; 331/154
(58) Field of Search .................... 310/309; 333/186, 333/197; 331/116 M, 177 V, 154

(56) References Cited

U.S. PATENT DOCUMENTS

| | | | |
|---|---|---|---|
| 4,081,769 A | 3/1978 | Shreve | 333/72 |
| 4,262,269 A | 4/1981 | Griffin et al. | 333/204 |
| 4,596,969 A | 6/1986 | Jachowski | 333/203 |
| 4,660,004 A | 4/1987 | Jachowski | 333/134 |
| 4,721,925 A | 1/1988 | Farace et al. | 331/154 |
| 4,724,351 A | 2/1988 | EerNisse et al. | 310/320 |
| 4,862,122 A | 8/1989 | Blair, Jr. et al. | 333/202 |
| 5,025,346 A | 6/1991 | Tang et al. | 361/203 |
| 5,065,119 A | 11/1991 | Jachowski | 333/202 |
| 5,090,254 A | 2/1992 | Guckel et al. | 73/862.59 |
| 5,191,304 A | 3/1993 | Jachowski | 333/202 |
| 5,399,232 A | 3/1995 | Albrecht et al. | 156/633 |
| 5,428,325 A | 6/1995 | Jachowski et al. | 333/203 |
| 5,446,729 A | 8/1995 | Jachowski | 370/37 |
| 5,455,547 A | 10/1995 | Lin et al. | 333/186 |
| 5,491,604 A | 2/1996 | Nguyen et al. | 361/278 |
| 5,537,083 A | 7/1996 | Lin et al. | 333/186 |
| 5,550,516 A | 8/1996 | Burns et al. | 331/65 |

(List continued on next page.)

OTHER PUBLICATIONS

C. T.–C. Nguyen, "Micromechanical Resonators for Oscillators and Filters," IEEE Ultrasonics Syposium, 1995, pp. 489–499.

K. Wang et al., "VHF Free—Free Beam High–Q Micromechanical Resonators," Center For Integrated Microsystems, 1999, pp. 453–458.

K. Wang et al., "High–Order Micromechanical Electronic Filters," Center For Integrated Sensors and Circuits, 1997, pp. 25–30.

Nguyen, Clark T.–C., et al., Design and Performance of CMOS Micromechanical Resonator Oscillators, IEEE International Frequency Control Symposium, 1994. pp. 127–134, 1/94.

(List continued on next page.)

Primary Examiner—Thomas M. Dougherty
(74) Attorney, Agent, or Firm—Brooks Kushman P.C.

(57) ABSTRACT

Several MEMS-based methods and architectures which utilize vibrating micromechanical resonators in circuits to implement filtering, mixing, frequency reference and amplifying functions are provided. Apparatus is provided for filtering signals utilizing vibrating micromechanical resonators. One of the primary benefits of the use of such architectures is a savings in power consumption by trading power for high selectivity (i.e., high Q). Consequently, the present invention relies on the use of a large number of micromechanical links in SSI networks to implement signal processing functions with basically zero DC power consumption.

32 Claims, 12 Drawing Sheets

U.S. PATENT DOCUMENTS

| | | | |
|---|---|---|---|
| 5,578,976 A | 11/1996 | Yao | 333/262 |
| 5,589,082 A | 12/1996 | Lin et al. | 257/528 |
| 5,619,061 A | 4/1997 | Goldsmith et al. | 257/528 |
| 5,640,133 A | 6/1997 | MacDonald et al. | 333/197 |
| 5,783,973 A | 7/1998 | Weinberg et al. | 331/35 |
| 5,839,062 A | 11/1998 | Nguyen et al. | 455/323 |
| 5,858,809 A * | 1/1999 | Chau et al. | 438/52 |
| 5,872,489 A | 2/1999 | Chang et al. | 331/179 |
| 5,880,369 A * | 3/1999 | Samuels et al. | 73/514.32 |
| 5,918,280 A * | 6/1999 | Gang et al. | 73/1.37 |
| 5,955,932 A | 9/1999 | Nguyen et al. | 333/186 |
| 5,963,857 A | 10/1999 | Greywall | 455/307 |
| 5,976,994 A | 11/1999 | Nguyen et al. | 438/795 |
| 6,016,092 A | 1/2000 | Qiu et al. | 333/262 |
| 6,049,702 A | 4/2000 | Tham et al. | 455/78 |
| 6,067,858 A * | 5/2000 | Clark et al. | 73/504.16 |
| 6,121,552 A * | 9/2000 | Brosnihan et al. | 174/253 |
| 6,169,321 B1 | 1/2001 | Nguyen et al. | 257/536 |
| 6,249,073 B1 * | 6/2001 | Nguyen et al. | 310/309 |
| 6,275,324 B1 * | 8/2001 | Sneh | 359/223 |
| 6,278,342 B1 * | 8/2001 | Ella | 333/189 |
| 6,296,779 B1 * | 10/2001 | Clark et al. | 216/2 |

OTHER PUBLICATIONS

Wang, Kun, et al., Q–Enhancement of Microelectromechanical Filters Via Low–Velocity Spring Coupling, IEEE Ultrasonics Symposium, 1997, pp. 323–327, 8/97.

Bannon, III, Frank D., et al., High Frequency Microelectromechanical IF Filters, IEEE Electron Devices Meeting, 1996, pp. 30.4.1–30.4.4, 12/96.

Clark, John R., et al., Parallel–Resonator HF Micromechanical Bandpass Filters, IEEE International Conference on Solid–State Sensors And Actuators, 1997, pp. 1161–1164, 6/97.

* cited by examiner

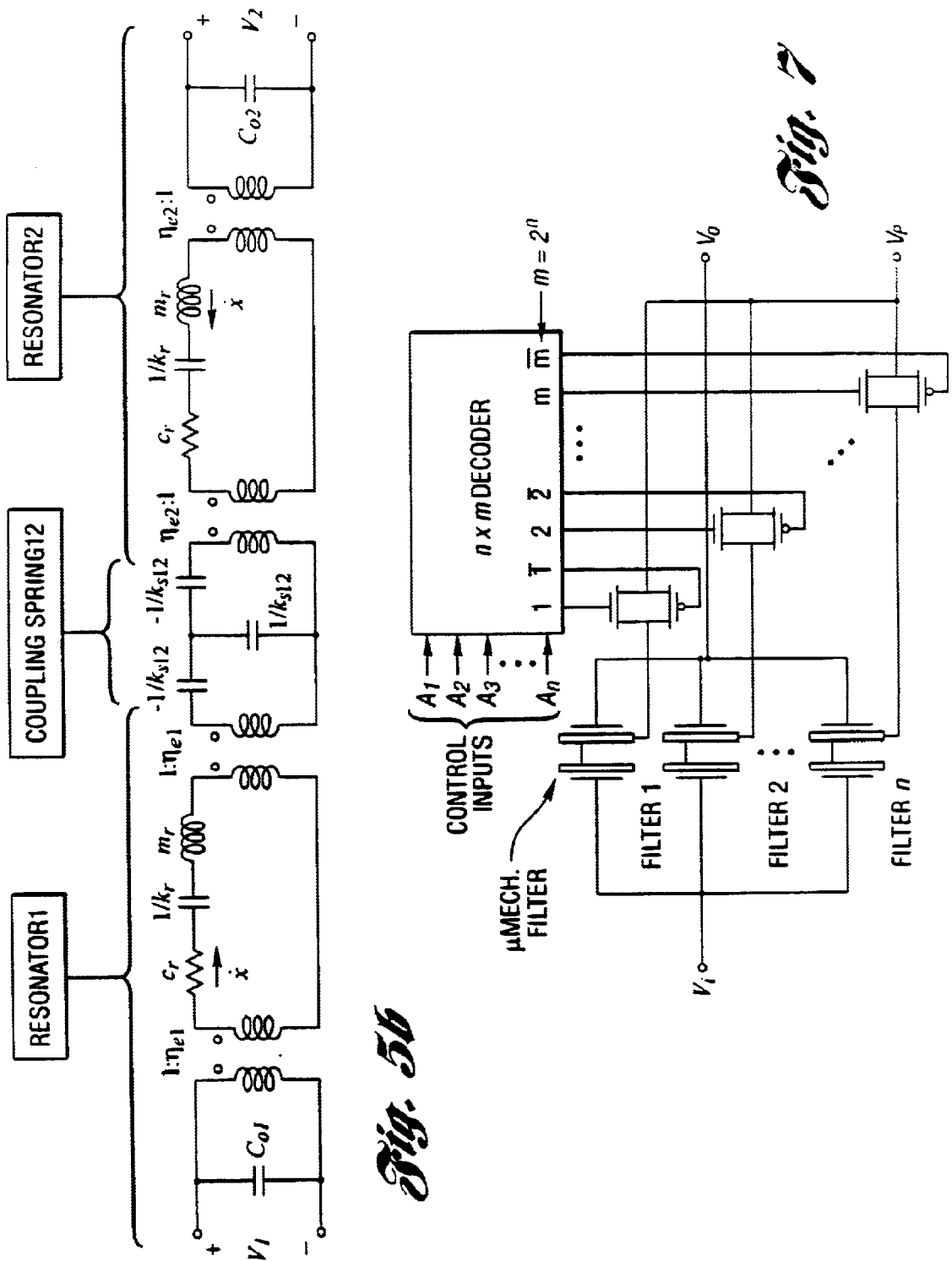

METHOD AND APPARATUS FOR FILTERING SIGNALS UTILIZING A VIBRATING MICROMECHANICAL RESONATOR

CROSS-REFERENCE TO RELATED APPLICATIONS

This application is a continuation-in-part of U.S. patent application entitled "Device Including A Micromechanical Resonator Having An Operating Frequency And Method Of Extending Same" filed Jan. 13, 2000 and having U.S. Ser. No. 09/482,670, now U.S. Pat. No. 6,249,073, which, in turn, claims the benefit of U.S. provisional application entitled "VHF Free-Free Beam High-Q Micromechanical Resonators", filed Jan. 14, 1999 and having U.S. Ser. No. 60/115,882. This application also claims the benefit of U.S. provisional application entitled "Transceiver Front-End Architectures Using Vibrating Micromechanical Signal Processors" filed Apr. 20, 2000 and having U.S. Ser. No. 60/199,063.

STATEMENT REGARDING FEDERALLY SPONSORED RESEARCH OR DEVELOPMENT

This invention was made with government support under Contract No. F30602-97-2-0101 awarded by DARPA. The government has certain rights in the invention.

BACKGROUND OF THE INVENTION

1. Field of the Invention

This invention relates to methods and apparatus for filtering signals utilizing a vibrating micromechanical resonator.

2. Background Art

The need for passive off-chip components has long been a key barrier against communication transceiver miniaturization. In particular, the majority of the high-Q bandpass filters commonly used in the RF and IF stages of heterodyning transceivers are realized using off-chip, mechanically-resonant components, such as crystal and ceramic filters and SAW devices, as illustrated in FIG. 1. Due to higher quality factor Q, such technologies greatly outperform comparable filters implemented using transistor technologies, in insertion loss, percent bandwidth, and achievable rejection. High Q is further required to implement local oscillators or synchronizing clocks in transceivers, both of which must satisfy strict phase noise specifications. Again, as illustrated in FIG. 1, off-chip elements (e.g., quartz crystals) are utilized for this purpose.

Being off-chip components, the above mechanical devices must interface with integrated electronics at the board level, and this constitutes an important bottleneck against the miniaturization of super-heterodyne transceivers. For this reason, recent attempts to achieve single-chip transceivers for paging and cellular communications have utilized alternative architectures that attempt to eliminate the need for off-chip high-Q components via higher levels of transistor integration. Unfortunately, without adequate front-end selectivity, such approaches have suffered somewhat in overall performance, to the point where they so far are usable only in less demanding applications.

Given this, and recognizing that future communication needs will most likely require higher levels of performance, single-chip transceiver solutions that retain high-Q components and that preserve super-heterodyne-like architectures are desirable.

Recent demonstrations of vibrating beam micromechanical ("μmechanical") resonator devices with frequencies in the VHF range and Q's in the tens of thousands have sparked a resurgence of research interest in communication architectures using high-Q passive devices as disclosed in the above-noted patent application entitled "Device Including A Micromechanical Resonator Having An Operating Frequency and Method of Extending Same." Much of the interest in these devices derives from their use of IC-compatible microelectromechanical systems (MEMS) fabrication technologies to greatly facilitate the on-chip integration of ultra-high-Q passive tanks together with active transistor electronics, allowing substantial size reduction.

FIG. 2 illustrates a comparison of MEMS and SAW technologies wherein MEMS offers the same or better high-Q frequency selectivity with orders of magnitude smaller size. Indeed, reductions in size and board-level packaging complexity, as well as the desire for the high performance attainable by super-heterodyne architectures, are principal drivers for this technology.

Although size reduction is certainly an advantage of this technology (commonly dubbed "RF MEMS"), it merely touches upon a much greater potential to influence general methods for signal processing. In particular, since they can now be integrated (perhaps on a massive scale) using MEMS technology, vibrating μmechanical resonators (or μmechanical links) can now be thought of as tiny circuit elements, much like resistors or transistors, in a new mechanical circuit technology. Like a single transistor, a single mechanical link does not possess adequate processing power for most applications. However, again like transistors, when combined into larger (potentially, VLSI) circuits, the true power of μmechanical links can be unleashed, and signal processing functions with attributes previously inaccessible to transistor circuits may become feasible.

The Need for High Q in Oscillators

For any communications application, the stability of the oscillator signals used for frequency translation, synchronization, or sampling, is of utmost importance. Oscillator frequencies must be stable against variations in temperature against aging, and against any phenomena, such as noise or microphonics, that cause instantaneous fluctuations in phase and frequency. The single most important parameter that dictates oscillator stability is the Q of the frequency-setting tank (or of the effective tank for the case of ring oscillators). For a given application, and assuming a finite power budget, adequate long- and short-term stability of the oscillation frequency is insured only when the tank Q exceeds a certain threshold value.

Given the need for low power in portable units, and given that the synthesizer (containing the reference and VCO oscillators) is often a dominant contributor to total transceiver power consumption, modern transceivers could benefit greatly from technologies that yield high-Q tank components.

The Need for High Q in Filters

Tank Q also greatly influences the ability to implement extremely selective IF and RF filters with small percent bandwidth, small shape factor, and low insertion loss. As tank Q decreases, insertion loss increases very quickly, too much even for IF filters, and quite unacceptable for RF filters. As with oscillators, high-Q tanks are required for RF and IF filters alike, although more so for the latter, since channel selection is done predominantly at the IF in super-heterodyne receivers. In general, the more selective the filter, the higher the resonator Q required to achieve a given level of insertion loss.

Micromechanical Circuits

Although mechanical circuits, such as quartz crystal resonators and SAW filters, provide essential functions in the majority of transceiver designs, their numbers are generally suppressed due to their large size and finite cost. Unfortunately, when minimizing the use of high-Q components, designers often trade power for selectivity (i.e., Q), and hence, sacrifice transceiver performance. As a simple illustration, if the high-Q IF filter in the receive path of a communication subsystem is removed, the dynamic range requirement on the subsequent IF amplifier, IQ mixer, and A/D converter circuits, increases dramatically, forcing a corresponding increase in power consumption. Similar trade-offs exist at RF, where the larger the number or greater the complexity of high-Q components used, the smaller the power consumption in surrounding transistor circuits.

The Micromechanical Beam Element

To date, the majority of μmechanical circuits most useful for communication applications in the VHF range have been realized using μmechanical flexural-mode beam elements, such as shown in FIG. 2 with clamped-clamped boundary conditions. Although several micromachining technologies are available to realize such an element in a variety of different materials, surface micromachining has been the preferred method for μmechanical communication circuits, mainly due to its flexibility in providing a variety of beam end conditions and electrode locations, and its ability to realize very complex geometries with multiple levels of suspension.

U.S. Pat. No. 6,049,702 to Tham et al. discloses an integrated passive transceiver section wherein microelectromechanical (MEM) device fabrication techniques are used to provide low loss, high performance switches. Utilizing the MEM devices also makes possible the fabrication and use of several circuits comprising passive components, thereby enhancing the performance characteristics of the transceiver.

U.S. Pat. No. 5,872,489 to Chang et al. discloses an integrated tunable inductance network and method. The network utilizes a plurality of MEM switches which selectively interconnect inductance devices thereby providing a selective inductance for a particular circuit.

U.S. Pat. No. 5,963,857 to Greywall discloses an article comprising a micromachined filter. In use, the micromachined filters are assembled as part of a radio to miniaturize the size of the radio.

U.S. Pat. Nos. 5,976,994 and 6,169,321 to Nguyen et al. disclose a batch-compatible, post-fabrication annealing method and system to trim the resonance frequency and enhance the quality factor of micromechanical structures.

U.S. Pat. Nos. 5,455,547; 5,589,082 and 5,537,083 to Lin et al. disclose microelectromechanical signal processors. The signal processors include many individual microelectromechanical resonators which enable the processor to function as a multi-channel signal processor or a spectrum analyzer.

U.S. Pat. No. 5,640,133 to MacDonald et al. discloses a capacitance-based, tunable, micromechanical resonator. The resonators may be selectively tuned and used in mechanical oscillators, accelerometers, electromechanical filters and other electronic devices.

U.S. Pat. No. 5,578,976 to Yao, U.S. Pat. No. 5,619,061 to Goldsmith et al. and U.S. Pat. No. 6,016,092 to Qiu et al. disclose various micromechanical and microelectromechanical switches used in communication apparatus.

U.S. Pat. No. 5,839,062 to Nguyen et al. disclose a MEMS-based receiver including parallel banks of microelectromechanical filters.

U.S. Pat. Nos. 5,491,604 and 5,955,932 to Nguyen et al. disclose Q-controlled microresonators and tunable filters using the resonators.

U.S. Pat. No. 5,783,973 to Weinberg et al. discloses a micromechanical, thermally insensitive silicon resonator and oscillator.

The following articles are of general interest: Nguyen et al., "Design and Performance of CMOS Micromechanical Resonator Oscillators", 1994 IEEE International Frequency Control Symposium, pp. 127–134; Wang et al, "Q-Enhancement of Microelectromechanical Filters Via Low-Velocity Spring Coupling", 1997 IEEE Ultrasonics Symposium, pp. 323–327; Bannon, III et al., "High Frequency Microelectromechanical IF Filters", 1996 IEEE Electron Devices Meeting, San Francisco, Calif., Dec. 8–11, 1996, pp. 773–776; and Clark et al., "Parallel-Resonator HF Micromechanical Bandpass Filters" 1997 International Conference On Solid-State Sensors And Actuators", pp. 1161–1164.

U.S. Pat. No. 5,640,133 to MacDonald et al. discloses a capacitance-based tunable micromechanical resonator. The resonator includes a movable beam which holds a plurality of electrodes. The resonator also includes a plurality of stationary electrodes. In operation, an adjustable bias voltage, applied to the beam electrodes and the stationary electrodes, is used to adjust the resonant frequency of the resonator.

U.S. Pat. No. 5,550,516 to Burns et al. discloses an integrated resonant microbeam sensor and transistor oscillator. The sensor and oscillator, capable of providing high-Q values, utilizes various circuitry, electrode placement, and various configurations of microbeam geometry to vary the operating resonant frequency.

U.S. Pat. No. 5,399,232 to Albrecht et al. discloses a microfabricated cantilever stylus with an integrated pyramidal tip. The pyramidal tip, integrally formed on the cantilever arm, limits the movement of the arm in the direction of the tip.

U.S. Pat. No. 4,262,269 to Griffin et al. discloses a Q-enhanced resonator which utilizes resonator positioning to provide a desired performance. Resonators are separated by one-quarter-wavelength distances to obtain desired loss characteristics.

U.S. Pat. No. 4,721,925 to Farace et al. discloses a micromechanical electronic oscillator etched from a silicon wafer. The patent discusses the configuration and the circuitry which enables the oscillator to perform according to desired characteristics.

The following U.S. patents are generally related to this invention: U.S. Pat. Nos. 4,081,769; 4,596,969; 4,660,004; 4,862,122; 5,065,119; 5,191,304, 5,446,729; 5,428,325, 5,025,346; 5,090,254; 5,455,547; 5,491,604; 5,537,083; and 5,589,082.

SUMMARY OF THE INVENTION

An object of the present invention is to provide a method and apparatus for filtering signals utilizing a vibrating micromechanical resonator wherein the resonator is isolated from a support structure for the resonator during resonator vibration.

In carrying out the above object and other objects of the present invention, a method is provided for filtering signals to obtain a desired passband of frequencies. The method includes providing a micromechanical filter apparatus including a micromechanical resonator having a fundamental resonant mode formed on a substrate and a support structure anchored to the substrate to support the resonator above the substrate. The method also includes vibrating the resonator so that the apparatus passes a desired frequency range of signals while substantially attenuating signals outside the desired frequency range. The support structure is attached to the resonator so that the resonator is isolated from the support structure during resonator vibration.

The step of vibrating may include forcing different portions of the resonator to move in opposite directions at the same time so that the resonator vibrates in a resonant mode, m, higher than the fundamental resonant mode wherein the resonator has m+1 nodal points.

The micromechanical filter apparatus may include a plurality of input electrodes spaced along the resonator to allow electrostatic excitation of the resonator. The step of forcing may include the steps of applying an in-phase signal to one of the input electrodes to deflect a first portion of the resonator in a first direction and applying an out-of-phase signal to another input electrode to deflect a second portion of the resonator in a second direction opposite the first direction to force the resonator into a correct mode shape.

The micromechanical filter apparatus may include an input electrode formed on the substrate to allow electrostatic excitation of the resonator. The step of forcing may include the step of applying a signal to the input electrode. The resonator and the input electrode may define a capacitive transducer gap therebetween. The resonator may further include m+1 spacers having a height and which extend between the resonator and the substrate at the m+1 nodal points. The m+1 spacers force the resonator into a correct mode shape during the application of the signal to the input electrode.

Further, in carrying out the above object and other objects of the present invention a micromechanical filter apparatus for filtering signals to obtain a desired passband of frequencies is provided. The apparatus includes a substrate, a plurality of intercoupled micromechanical elements including a resonator and a support structure anchored to the substrate to support the elements above the substrate. The support structure and the resonator are both dimensioned so that the resonator is isolated from the support structure during resonator vibration. Energy losses to the substrate are substantially eliminated. The apparatus is a high-Q apparatus.

The support structure may be attached to the resonator at at least one nodal point of the resonator.

The signals may be RF signals.

The apparatus may be an RF filter apparatus.

The apparatus may be a bandpass filter apparatus.

The support structure may include at least one beam attached to a nodal point of the resonator.

The apparatus may further include at least one input electrode formed on the substrate to allow electrostatic excitation of the resonator wherein the resonator and the at least one input electrode define a capacitive transducer gap therebetween.

The apparatus may further include at least one spacer having a height. Each spacer extends between the resonator and the substrate at a nodal point of the resonator. The size of the gap is based on the height of the at least one spacer during pull down of the resonator.

The apparatus may be a silicon-based filter apparatus.

The apparatus may be a diamond-based filter apparatus.

The apparatus may further include at least one output electrode formed on the substrate to sense output of the apparatus.

The support structure may include a plurality of beams and the resonator may include a plurality of nodal points. Each of the beams is attached to the resonator at one of the nodal points of the resonator so that the resonator sees substantially no resistance to transverse or torsional motion from the support structure.

A pair of balanced input electrodes may be formed on the substrate to allow electrostatic excitation of the resonator.

A pair of balanced output electrodes may be formed on the substrate to sense output of the apparatus.

The plurality of intercoupled micromechanical elements may include a pair of intercoupled end resonators.

The support structure may support the end resonators above the substrate.

The plurality of intercoupled micromechanical elements may include an inner resonator intercoupled to the end resonators.

The support structure may support the end and inner resonators above the substrate.

The plurality of intercoupled micromechanical elements may further include a plurality of coupling links for coupling the inner resonator to the end resonators.

The coupling links may be operable in multiple modes.

The coupling links may be higher mode coupling beams.

The above object and other objects, features, and advantages of the present invention are readily apparent from the following detailed description of the best mode for carrying out the invention when taken in connection with the accompanying drawings.

BRIEF DESCRIPTION OF THE DRAWINGS

FIG. 2b is a prior art, enlarged schematic perspective view of one of the MEMS resonators as indicated at 2b in FIG. 2a;

FIG. 5b is an electrical equivalent circuit for the filter of FIG. 5a;

FIG. 6 is a system level block diagram of an RF front-end receiver including an RF channel-select receiver architecture utilizing large numbers of micromechanical resonators in banks and schematically and perspectively illustrating a typical micromechanical filter of FIG. 5a;

FIG. 7 is a system/circuit diagram for an RF channel-select micromechanical filter bank;

DETAILED DESCRIPTION OF THE PREFERRED EMBODIMENT(S)

Figure 3:
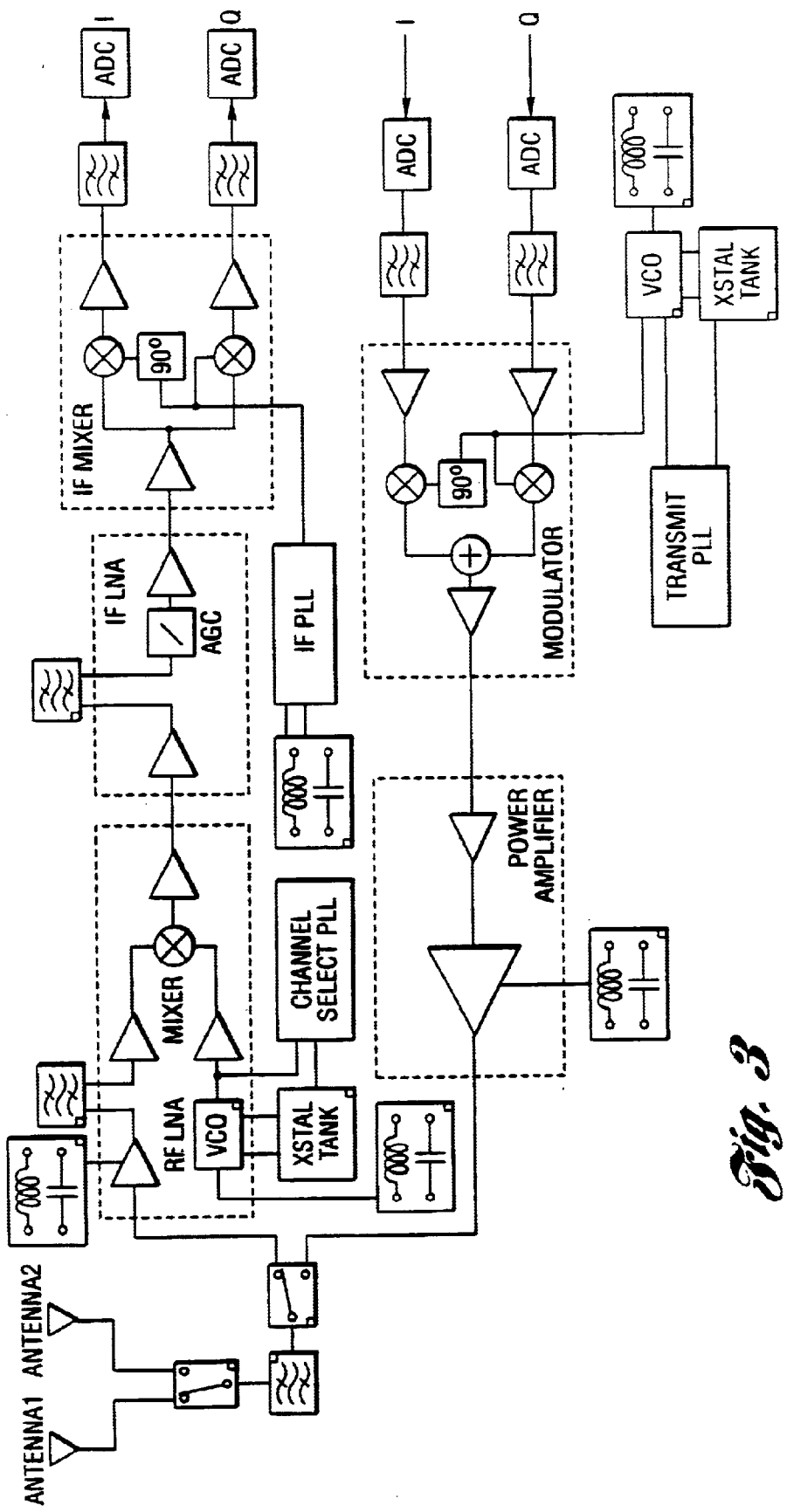
FIG. 3 is a system level schematic block diagram of the front-end design for a typical wireless transceiver showing off-chip, high-Q, passive components targeted for replacement via micromechanical versions of the present invention.

To illustrate more concretely the specific transceiver functions that can benefit from micromechanical implementations to be discussed herein, FIG. 3 presents a system level schematic block diagram for a typical super-heterodyne wireless transceiver. A small box is positioned in the corner of each box to represent a component that can be replaced with a micromechanical (MEMS) version. As implied in FIG. 3, several of the constituent components can already be miniaturized using integrated circuit transistor technologies. These include the low noise amplifiers (LNA's) in the receive path, the solid-state power amplifier (SSPA) in the transmit path, synthesizer phase-locked loop (PLL) electronics, mixers, and lower frequency digital circuits for baseband signal demodulation. Due to noise, power, and frequency considerations, the SSPA (and sometimes the LNA's) are often implemented using compound semiconductor technologies (i.e., GaAs). Thus, they often occupy their own chips, separate from the other mentioned transistor-based components, which are normally realized using silicon-based bipolar and CMOS technologies. However, given the rate of improvement of silicon technologies (silicon-germanium included), all of the above functions may be integrated onto a single-chip.

Figure 1:
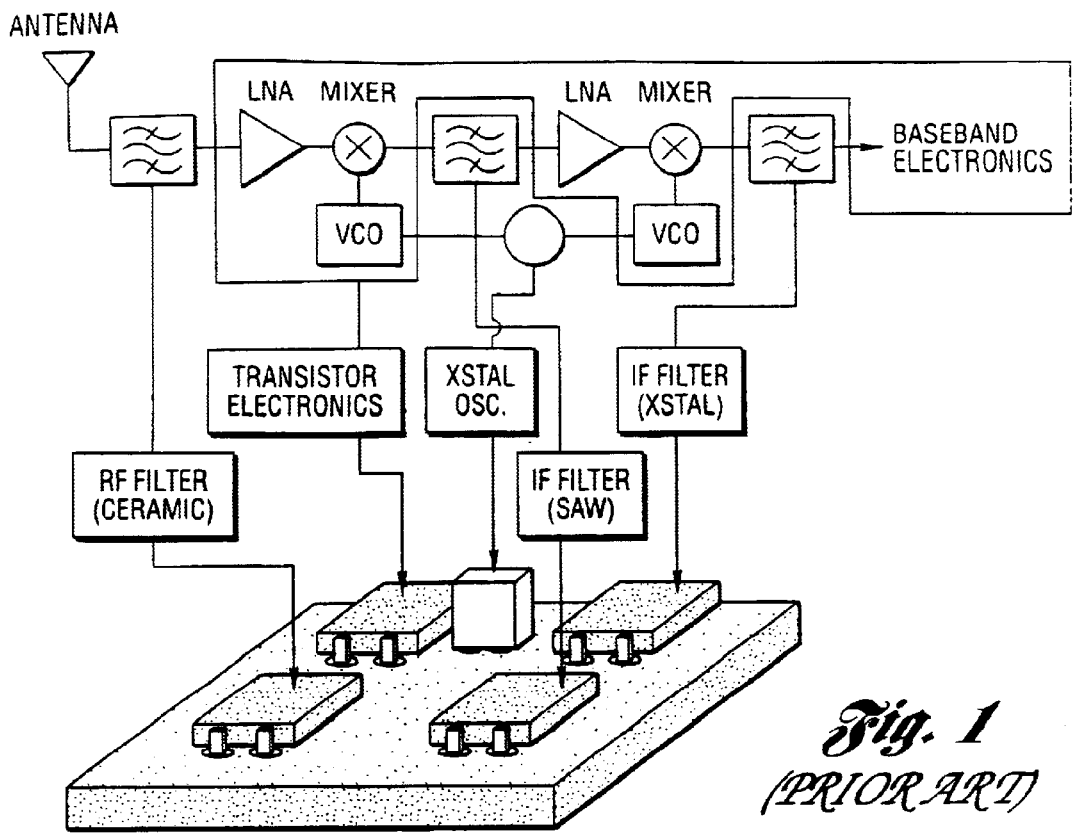
FIG. 1 is a prior art, schematic view of the front-end of a transceiver including off-chip, board-level implementation of SAW, ceramic and crystal resonators in a schematic perspective view.
Figure 2A:
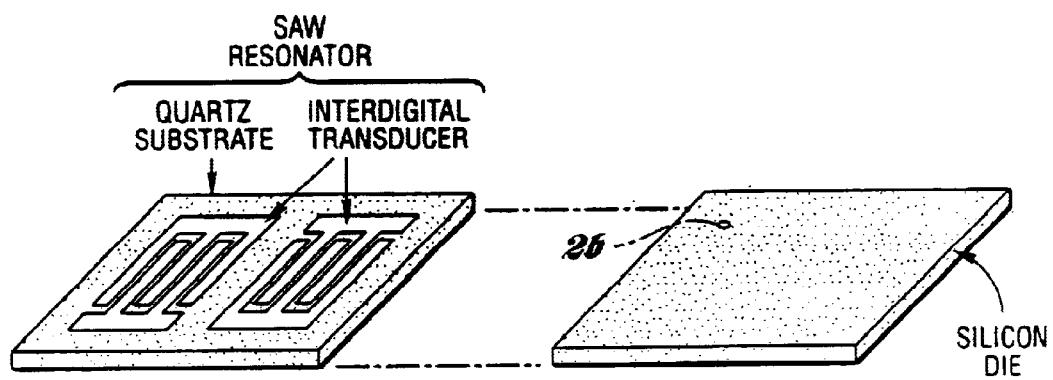
FIG. 2a is a prior art, schematic perspective view of a SAW resonator and a number of MEMS resonators formed on a silicon die to compare the two approaches.
Figure 2B:
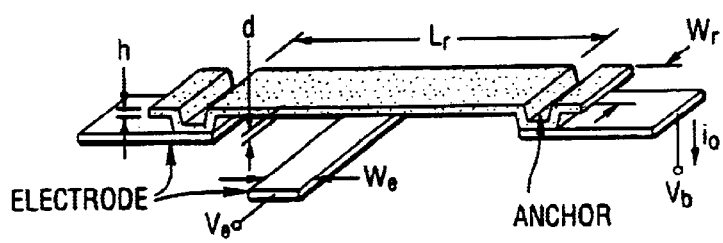

Unfortunately, placing all of the above functions onto a single chip does very little toward decreasing the overall super-heterodyne transceiver size, which is dominated not by transistor-based components, but by the numerous passive components indicated in FIGS. 1 and 3. The presence of so many frequency-selective passive components is easily justified when considering that communication systems designed to service large numbers of users require numerous communication channels, which in many implementations (e.g., Time Division Multiple Access (TDMA)) must have small bandwidths and must be separable by transceiver devices used by the system. The requirement for small channel bandwidths results in a requirement for extremely selective filtering devices for channel selection and extremely stable (noise-free) local oscillators for frequency translation. For the vast majority of cellular and cordless standards, the required selectivity and stability can only be achieved using high-Q components, such as discrete inductors, discrete tunable capacitors (i.e., varactors), and SAW and quartz crystal resonators, all of which interface with IC components at the board level. The needed performance cannot be achieved using conventional IC technologies, because such technologies lack the required Q. It is for this reason that virtually all commercially available cellular or cordless phones contain numerous passive SAW and crystal components.

Micromechanical Resonators

For communications applications, clamped-clamped and free-free flexural-mode beams with Q's on the order of 10,000 (in vacuum) and temperature coefficients on the order of −12 ppm/° C., are available for the VHF range, while thin-film bulk acoustic resonators (Q~1,000) have so far addressed the UHF range.

From a design perspective, one Q-limiting loss mechanism that becomes more important with increasing frequency is loss to the substrate through anchors. The frequency dependence of this mechanism arises because the stiffness of a given resonator beam generally increases with resonance frequency, giving rise to larger forces exerted by the beam on its anchors during vibration. As a consequence, more energy per cycle is radiated into the substrate via the anchors. Anti-symmetric resonance designs, such as balanced tuning forks, could prove effective in alleviating this source of energy loss.

Figure 15:
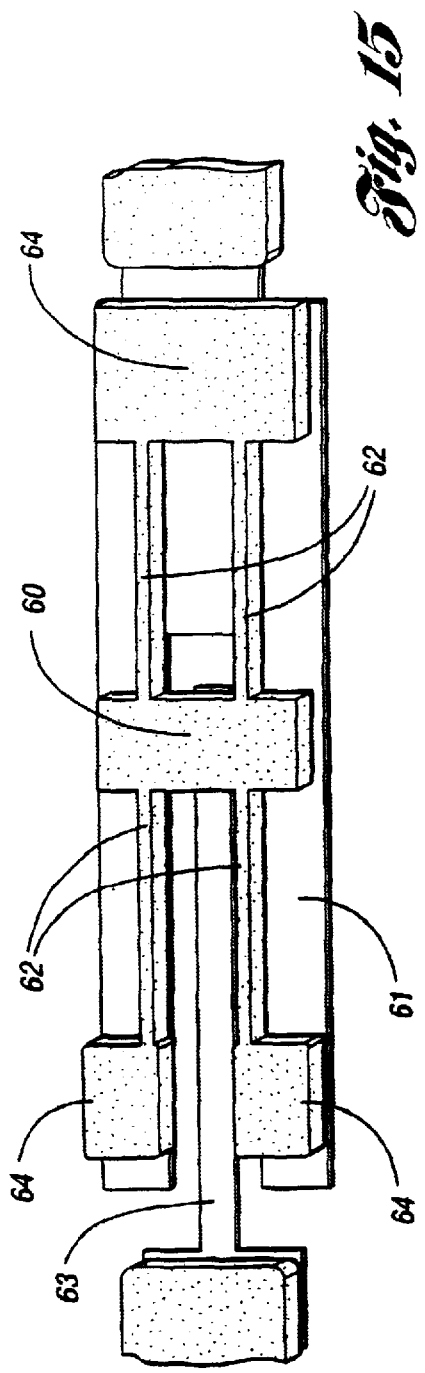
FIG. 15 is a schematic top perspective view of a 92 MHz (VHF) free-free beam polysilicon μmechanical resonator wherein support beams isolate the resonator beam element from a substrate thereby allowing higher Q operation.

Anchor loss mechanisms can be greatly alleviated by using "anchor-less" resonator designs, such as shown in the above-noted patent application Ser. No. 09/482,670 and as illustrated by the view of FIG. 15. This device utilizes a free-free beam (i.e., xylophone) 60 suspended above a ground plane and sense electrode 61 and a drive electrode 63 by four torsional support beams 62 attached at flexural node points. The beams 62, in turn, are supported at anchors 64. By choosing support dimensions corresponding to a quarter-wavelength of the free-free beam's resonance frequency, the impedance presented to the beam 60 by the supports 62 can be effectively nulled out, leaving the beam 60 virtually levitated and free to vibrate as if it had no supports. UHF frequency is obtained via use of free-free beam resonators specifically designed to operate at higher modes. The desired mode is selected (while suppressing other modes), by strategic placement and excitation of electrodes, and by the use of dimples under the structure 60 to force node locations corresponding to the desired mode. The mode can also be specified by placing the support beams at nodal locations, as in FIG. 17*a*.

Figure 16:
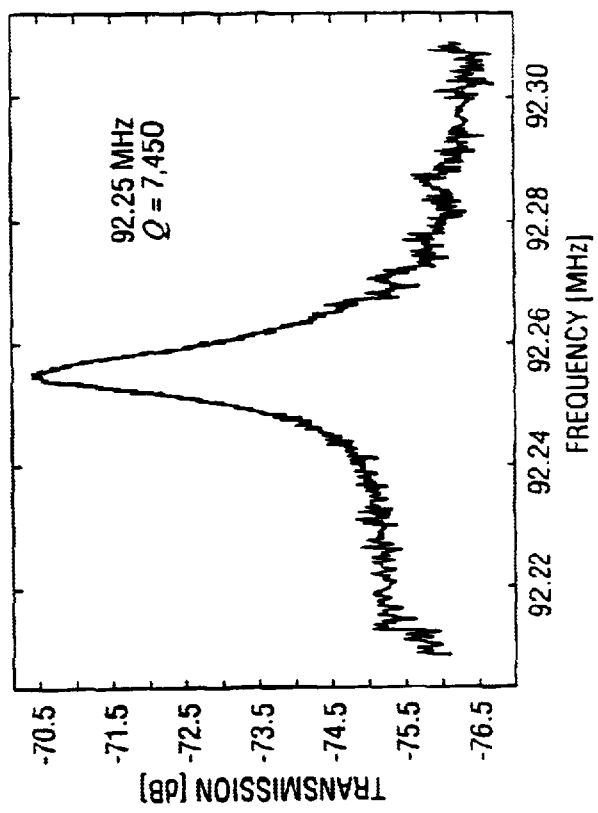
FIG. 16 is a graph illustrating a measured frequency characteristic for the resonator of FIG. 15.

FIG. 16 shows a frequency characteristic for a 92.25 MHz version of this μmechanical resonator with a Q of nearly 8,000—still plenty for channel-select RF applications.

Table 1 presents expected resonance frequencies for various beam dimensions, modes, and structural materials, showing a wide range of attainable frequencies, from VHF to UHF.

TABLE 1

μMechanical Resonator Frequency Design*

| Frequency (MHz) | Material | Mode | $h_r$ [μm] | $W_r$ [μm] | $L_r$ [μm] |
|---|---|---|---|---|---|
| 70 | silicon | 1 | 2 | 8 | 14.54 |
| 110 | silicon | 1 | 2 | 8 | 11.26 |
| 250 | silicon | 1 | 2 | 4 | 6.74 |
| 870 | silicon | 2 | 2 | 4 | 4.38 |
| 1800 | silicon | 3 | 1 | 4 | 3.09 |
| 1800 | diamond | 3 | 1 | 4 | 6.16 |

*Determined for free-free beams using Timoshenko methods that include the effects of finite h and $W_r$.

Micromechanical Filters

Figure 4:
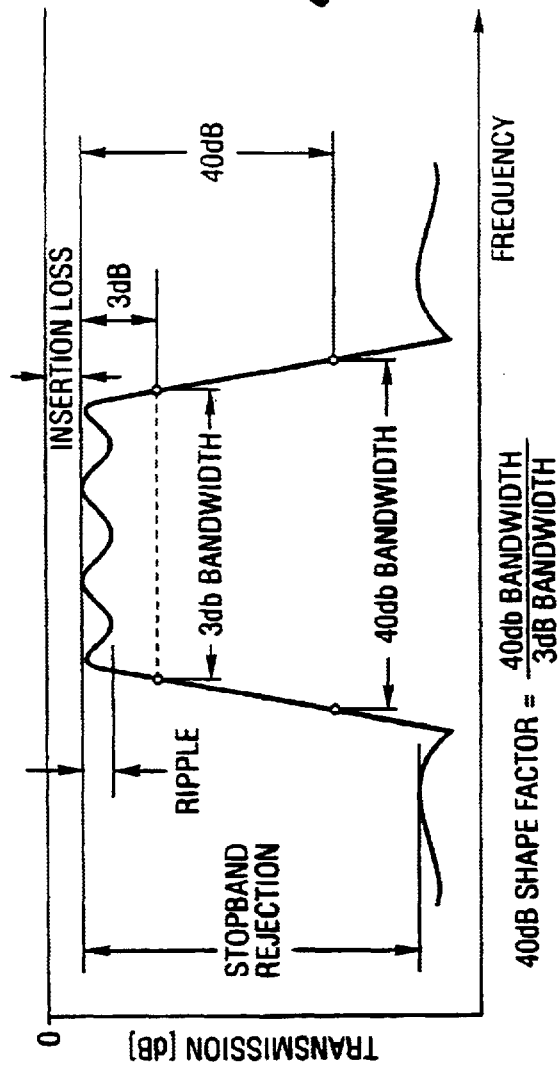
FIG. 4 is a graph of transmission [dB] versus frequency illustrating desired filter characteristics.

Among the more useful μmechanical circuits for communications are those implementing low-loss bandpass filters, capable of achieving frequency characteristics as shown in FIG. 4 where a broader frequency passband than achievable by a single resonator beam is shown, with a sharper roll-off to the stopband (i.e., smaller shape factor).

To achieve the characteristic of FIG. 4, a number of micromechanical resonators may be coupled together by soft coupling springs. By linking resonators together using (ideally) massless springs, a coupled resonator system is achieved that exhibits several modes of vibration. The frequency of each vibration mode corresponds to a distinct peak in the force-to-displacement frequency characteristic, and to a distinct, physical mode shape of the coupled mechanical resonator system. For the example case of a three-resonator filter, in the lowest frequency mode, all resonators vibrate in phase; in the middle frequency mode, the center resonator ideally remains motionless, while the end resonators vibrate 180° out of phase; and finally, in the highest frequency mode, each resonator is phase-shifted 180° from its adjacent neighbor. Without additional electronics, the complete mechanical filter exhibits a jagged passband. As described hereinbelow, termination resistors designed to lower the Q's of the input and output resonators by specific amounts are required to flatten the passband and achieve a more recognizable filter characteristic, such as in FIG. 4.

The filters use a number of high-Q micromechanical beam elements connected in a network that achieves the specified bandpass frequency response. If effect, a micromechanical filter is another example of a micromechanical circuit, similar to that of FIG. 15, but in this case using a plurality of beam elements to achieve a frequency shaping response not achievable by a single beam element.

In practical implementations, because planar IC processes typically exhibit substantially better matching tolerances than absolute, the constituent resonators in μmechanical filters are normally designed to be identical, with identical dimensions and resonance frequencies. For such designs, the center frequency of the overall filter is equal to the resonance frequency $f_o$ of the resonators, while the filter passband (i.e., the bandwidth) is determined by the spacings between the mode peaks.

The relative placement of the vibration peaks in the frequency characteristic—and thus, the passband of the eventual filter—is determined primarily by the stiffnesses of the coupling springs ($k_{sij}$) and of the constituent resonators at the coupling locations ($k_r$). Specifically, for a filter with center frequency $f_o$ and bandwidth B, these stiffnesses must satisfy the expression:

$$B = \left(\frac{f_o}{k_{ij}}\right)\left(\frac{k_{sij}}{k_r}\right) \quad (1)$$

where $k_{ij}$ is a normalized coupling coefficient found in filter cookbooks. The filter bandwidth is not dependent on the absolute values of resonator and coupling beam stiffness; rather, their ratio $k_{sij}/k_r$ dictates bandwidth. Thus, the procedure for designing a mechanical filter involves two main steps (not necessarily in this order): first, design of a mechanical resonator with resonance frequency $f_o$ and adjustable stiffness $k_r$; and second, design of coupling springs with appropriate values of stiffness $k_{sij}$ to enable a desired bandwidth within the adjustment range of resonator $k_r$'s.

To take advantage of the maturity of LC ladder filter synthesis techniques, the enormous database governing LC ladder filter implementations, and the wide availability of electrical circuit simulators, realization of a particular μmechanical filter often also involves the design of an LC ladder version to fit the desired specification. The elements in the LC ladder design are then matched to lumped mechanical equivalents via electromechanical analogy, where inductance, capacitance, and resistance in the electrical domain equate to mass, compliance, and damping, respectively, in the mechanical domain.

A Two-Resonator HF-VHF Micromechanical Filter

Figure 5A:
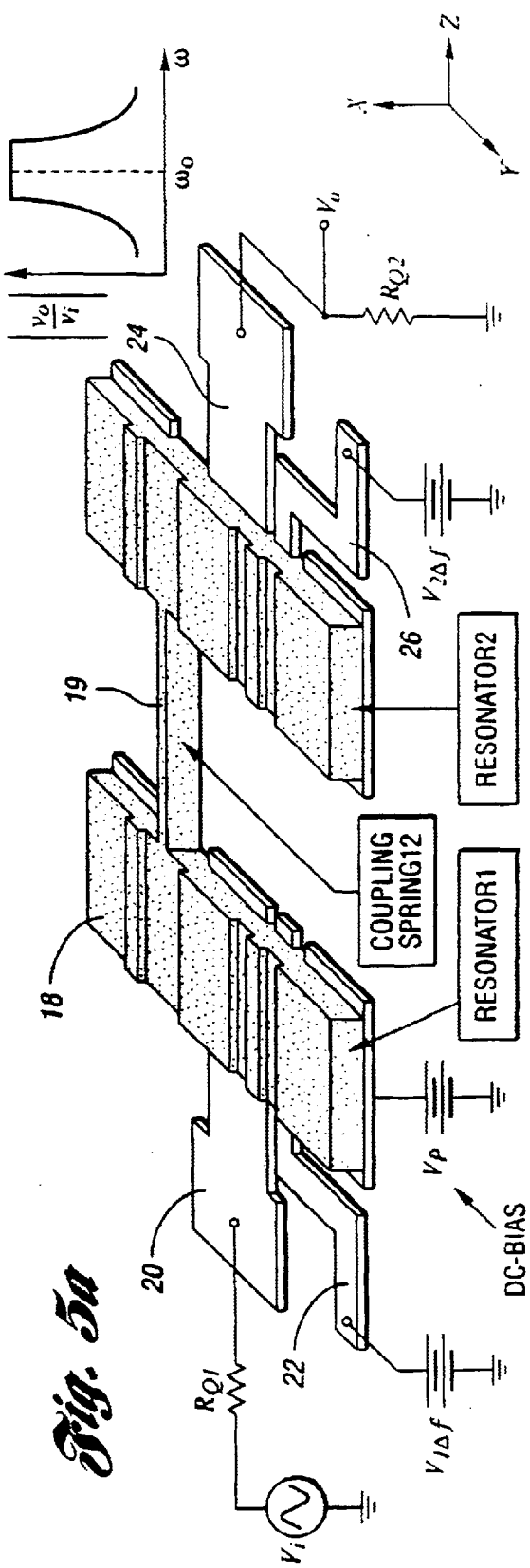
FIG. 5a is a perspective schematic view of a symmetrical two-resonator VHF μmechanical filter with typical bias, excitation and signal conditioning electronics.

FIG. 5a shows a perspective view schematic of a practical two-resonator micromechanical filter capable of operation in the HF to VHF range. As shown, the filter consists of two μmechanical clamped-clamped beam resonators with anchors 18 at their opposite ends, coupled mechanically by a soft coupling spring or beam 19, all suspended above a substrate (not shown). Conductive (polysilicon) strips 20, 22, 24, and 26 underlie each resonator by approximately 1000 Å (as also in FIGS. 6, 9 and 17a), a center one 20 serving as a capacitive transducer input electrode positioned to induce resonator vibration in a direction perpendicular to the substrate, a center one 24 serving as an output electrode and the flanking ones 22 and 26 serving as tuning or frequency pulling electrodes capable of voltage-controlled tuning of resonator frequencies. The resonator-to-electrode gaps are determined by the thickness of a sacrificial oxide spacer during fabrication and can thus be made quite small (e.g., 0.1 μm or less) to maximize electromechanical coupling.

The filter is excited with a DC-bias voltage $V_P$ applied to the conductive mechanical network, and an AC signal applied to the input electrode, but this time through an appropriately valued source resistance $R_Q$ that loads the Q of the input resonator to flatten the passband. The output resonator of the filter must also see a matched impedance to avoid passband distortion, and the output voltage $v_o$ is generally taken across this impedance. As described hereinbelow, the required value of I/O port termination resistance can be tailored for different applications, and this can be advantageous when designing low noise transistor circuits succeeding the filter, since such circuits can then be driven by optimum values of source resistance to minimize noise.

From a signal flow perspective, the operation of the above filter can be briefly summarized as follows:

(1) An electrical input signal is applied to the input port and converted to an input force by the electromechanical transducer (which for the case of FIG. 5a is capacitive) that can then induce mechanical vibration in the x direction;

(2) Mechanical vibration comprises a mechanical signal that is processed in the mechanical domain—specifically, the signal is rejected if outside the passband of the filter, and passed if within the passband; and (3) The mechanically processed signal appears as motion of the output resonator and is reconverted to electrical energy at the output transducer, ready for processing by subsequent transceiver stages.

From the above, the name "micromechanical signal processor" clearly suits this device. Details of the design procedure for micromechanical filters now follow.

HF-VHF Filter Design

As can be summarized from FIG. 5b, the network topologies for the mechanical filters of this work differ very little from those of their purely electronic counterparts, and in principal, can be designed at the system-level via a procedure derived from well-known, coupled resonator ladder filter synthesis techniques. In particular, given the equivalent LCR element values for a prototype μmechanical resonator, it is possible to synthesize a mechanical filter entirely in the electrical domain, converting to the mechanical domain only as the last step. However, although possible, such a procedure is not recommended, since knowledge and ease of design in both electrical and mechanical domains can greatly reduce the effort required.

The design procedure for the two-resonator micromechanical filter of FIG. 5a can be itemized as follows:

(1) Design and establish the μmechanical resonator prototype to be used, choosing necessary geometries for the needed frequency and insuring that enough electrode-to-resonator transducer coupling is provided to allow for predetermined termination resistor values. For a given resonator, with predetermined values of $W_r$, h, $W_e$, $V_P$, and $R_Q$, this amounts to solving for the resonator length $L_r$ and electrode-to-resonator gap spacing d that simultaneously satisfy a number of well known equations. Table 2 summarizes the needed gap spacings to achieve various values of $R_Q$ for micromechanical filters centered at 70 MHz and 870 MHz, and with Q=10,000, B=1.25 MHz, and $V_P$=10V.

TABLE 2

Two-Resonator μMechanical Filter
Electrode-to-Resonator Gap Spacing Design*

| Frequency | Gap Spacing, d, for $R_Q$ = | | | | |
|---|---|---|---|---|---|
| | 300Ω | 500Ω | 1,000Ω | 2,000Ω | 5,000Ω |
| 70 MHz[†] | 195Å | 223Å | 266Å | 317Å | 399Å |
| 870 MHz[‡] | 78Å | 81Å | 80Å | 95Å | 119Å |

*Determined with Q = 10,000, B = 1.25 MHz, $V_p$ = 10 V.
[†]CCBeam, polysilicon, $L_r$ = 14.52 μm, $W_r$ = 8 μm, h = 4 μm.
[‡]CCBeam, diamond, $L_r$ = 9.36 μm, $W_r$ = 8 μm, h = 4 μm.

(2) Choose a manufacturable value of coupling beam-width $W_{s12}$ and design coupling beam(s) corresponding to a "quarter-wavelength" of the filter center frequency. Here, the coupling beam is recognized as an acoustic transmission line that can be made transparent to the filter when designed with quarter-wavelength dimensions as described in the prior art.

(3) Determine the coupling location(s) on the resonators corresponding to the filter bandwidth of interest. This procedure is based upon two important properties of this filter and the resonators comprising it: First, the filter bandwidth B is determined not by absolute values of stiffness, but rather by a ratio of stiffnesses ($k_{s12}/k_{rc}$), where the subscript c denotes the value at the coupling location; and second, the value of resonator stiffness $k_{rc}$ varies with location (in particular, with location velocity) and so can be set to a desired value by simply choosing an appropriate coupling beam attachment point. The location is easily determined as described in the prior art.

(4) Generate a complete equivalent circuit for the overall filter and verify the design using a circuit simulator. FIG. 5b presents the equivalent circuit for the two-resonator micromechanical filter of FIG. 5a. Each of the outside resonators are modeled via circuits. The coupling beam actually operates as an acoustic transmission line, and thus, is modeled by a T-network of energy storage elements.

Transformers are used between the resonator and coupling beam circuits of FIG. 5b to model the velocity transformations that arise when attaching the coupling beams at locations offset from the center of the resonator beam. The whole circuit structure of FIG. 5b can be recognized as that of the LC ladder network for a bandpass filter.

Further details on the design of micromechanical filters can be found in the literature.

RF Micromechanical Filters

As shown in FIG. 16, one of the highest demonstrated frequencies to date for polysilicon micromechanical resonators is 92 MHz with a Q~8,000. The above-noted patent application Ser. No. 09/482,670 also discloses a way of extending the frequency. As shown in Table 1, the above frequency (and higher) is geometrically feasible, but special design and material precautions are necessary to maintain adequate Q as frequencies rise. If Q's can be maintained >5,000, then record insertion loss performance on the order of 0.5 dB should be achievable, which could greatly enhance the sensitivity of receivers used in both short- and long-range communications. In fact, if Q~10,000 can be achieved, then RF channel-selection would be achievable using a switchable bank of filters, one for each channel, as described hereinbelow. The ability to do channel-selection right at the front-end of a transceiver can potentially save substantial amounts of power in both the receive and transmit paths, due to relaxed dynamic range requirements and the ability to use higher efficiency power amplifiers.

Figures 17A, 17B:
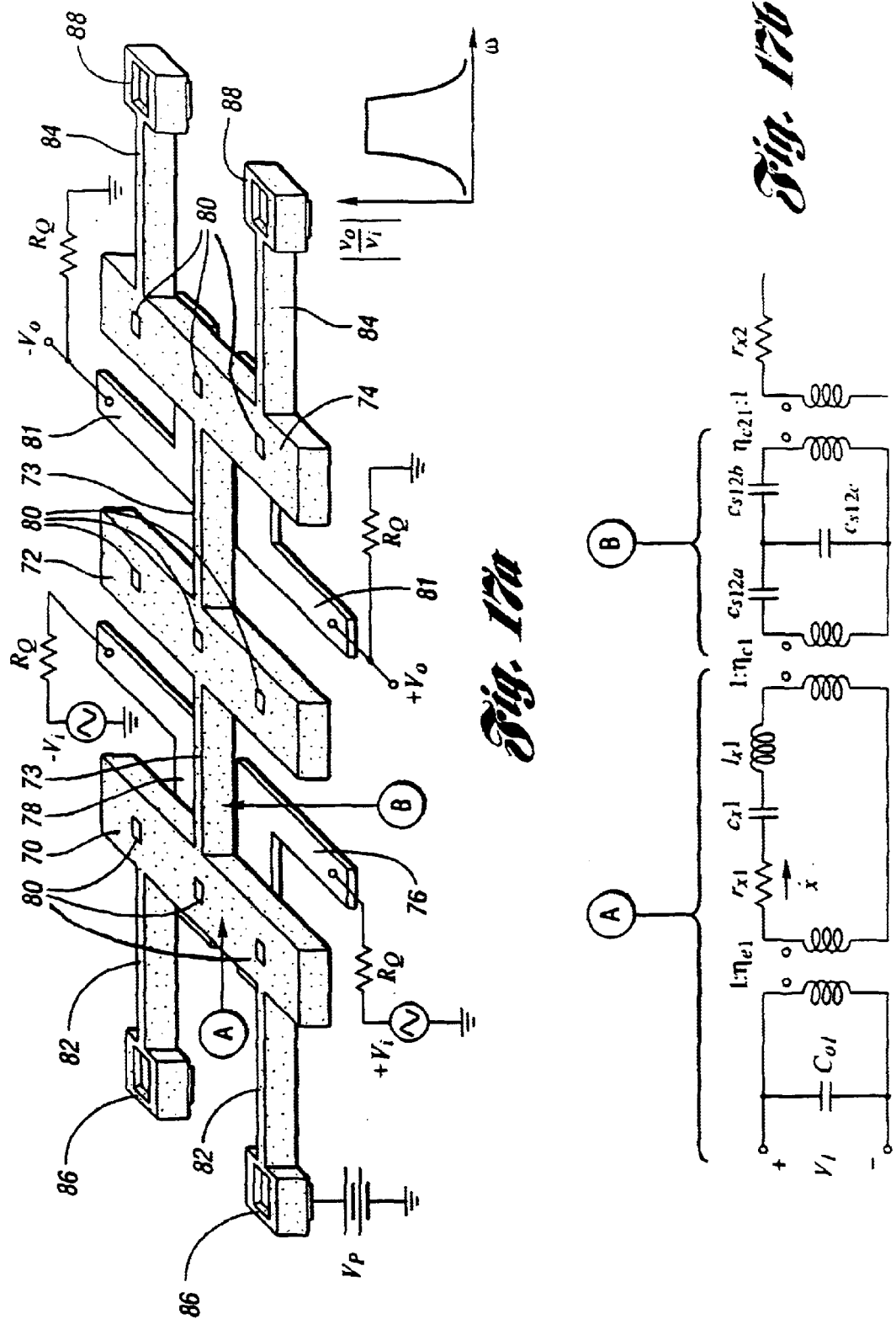
FIG. 17*a* is a schematic perspective view of a UHF μmechanical filter utilizing free-free beam μmechanical resonators designed to operate at a second mode.
FIG. 17*b* is a partial equivalent circuit for the filter of FIG. 17*a*, identifying the circuit functions of individual beam elements.

FIG. 17a is similar to FIG. 5a and presents the schematic of a filter structure, along with a partial equivalent electrical circuit of FIG. 17b (obtained via electromechanical analogy) that identifies the mechanical network as a bandpass filter. In particular, the filter structure is seen to be comprised of a number of mechanical resonators (modeled by LCR tanks) connected by acoustic transmission lines (modeled by T-networks of energy storage elements)—a structure similar to other resonator-based filters, but using micromechanical elements with orders of magnitude higher Q, giving it the ability to perform with much lower insertion loss than other technologies. (Not to mention orders of magnitude smaller size.)

In the design of FIG. 17a, UHF frequency is obtained via use of a second mode free-free beam resonator including beams 70 and 72 coupled together and to an output beam 74 by coupling beams 73. The resonator is specifically designed to operate at higher modes. The desired mode is selected (while suppressing other modes), by strategic placement and excitation of balanced input electrodes 76 and 78, and by the use of spacers or dimples 80 under the beams 70, 72 and 74 at flexural nodal points to force node locations corresponding to the desired mode.

Clearly for each mode, m, there exist m+1 nodal points of flexural deflection. One technique for exciting these higher modes is the use of differential signaling with the input electrodes 76 and 78. An in-phase signal may be applied to the electrode 76 that induces beam deflection in one direction, while an out-of-phase signal is applied to the electrode 78 that induces beam deflection in the opposite direction as dictated by the mode shape. This technique for second mode excitation is extended readily to any mode of vibration.

As an additional yield- and Q-enhancing feature, the capacitor gap spacing in this device is not entirely determined via a thin sacrificial oxide, as was done in previous clamped-clamped beam high frequency devices. Rather, a capacitor gap is now determined by the height of the dimples 80, set via a timed etch. The height of the dimples 80 is such that when a sufficiently large DC-bias is applied between the input electrodes 76 and 78 and the resonator beam 70 and between the output electrodes 81 and the beam 74, the whole structure comes down and rests upon the dimples 80, which are located at the flexural nodal points, and thus, have little impact on filter operation. The dimples 80 may be formed either on the beams 70, 72 and 74 or on the substrate.

The input electrodes 76 and 78 allow electrostatic excitation via an applied AC voltage. Balanced output electrodes 81 are positioned under the output beam 74. The output electrodes 81 senses or detect output currents off the beam 74.

The beams 70 and 74 are supported by non-intrusive supports or beams 82 and 84, respectively, which, in turn, are supported by anchors 86 and 88, respectively. While not illustrated, one support beam can be used for each beam 70 and 74 to further minimize energy dissipation. Alternatively one support beam can support all of the beams 70, 72 and 74.

The beams 82 and 84 are strategically designed with dimensions, so as to effect an impedance transformation that isolates the beams 70 and 74 from the rigid anchors 86 and 88, respectively. Ideally, the beams 70 and 74 see zero-impedance into their supports or beams 82 and 84, respectively, and thus, effectively operate as if levitated without any supports. As a result, anchor dissipation mechanisms normally found in previous clamped-clamped beam resonators are greatly suppressed, allowing much higher apparatus Q.

The filter of FIG. 17a constitutes the first attempt of its kind to implement filter circuits using free-free beam micromechanical resonators. Unlike previous filters using clamped-clamped beams (that could only attain VHF frequency), both transversal and torsional motions are considered for the coupling beams in FIG. 17a.

Because the beams 82 and 84 are attached at the node points, the support springs or beams 82 and 84 (ideally) sustain no translational movement during resonator vibration, and thus, support (i.e., anchor) losses due to translational movements—such as those sustained by clamped-clamped beam resonators—are greatly alleviated. Furthermore, with the recognition that the supporting torsional beams 82 and 84 actually behave like acoustic transmission lines at the frequencies of interest, torsional loss mechanisms can also be negated by strategically choosing support dimensions so that they present virtually no impedance to the beams 70 and 74. As a result, the beams 70 and 74 effectively "see" no supports at all and operate as if levitated above the substrate, devoid of anchors and their associated loss mechanisms.

Micromechanical Mixer-Filters

Figure 9:
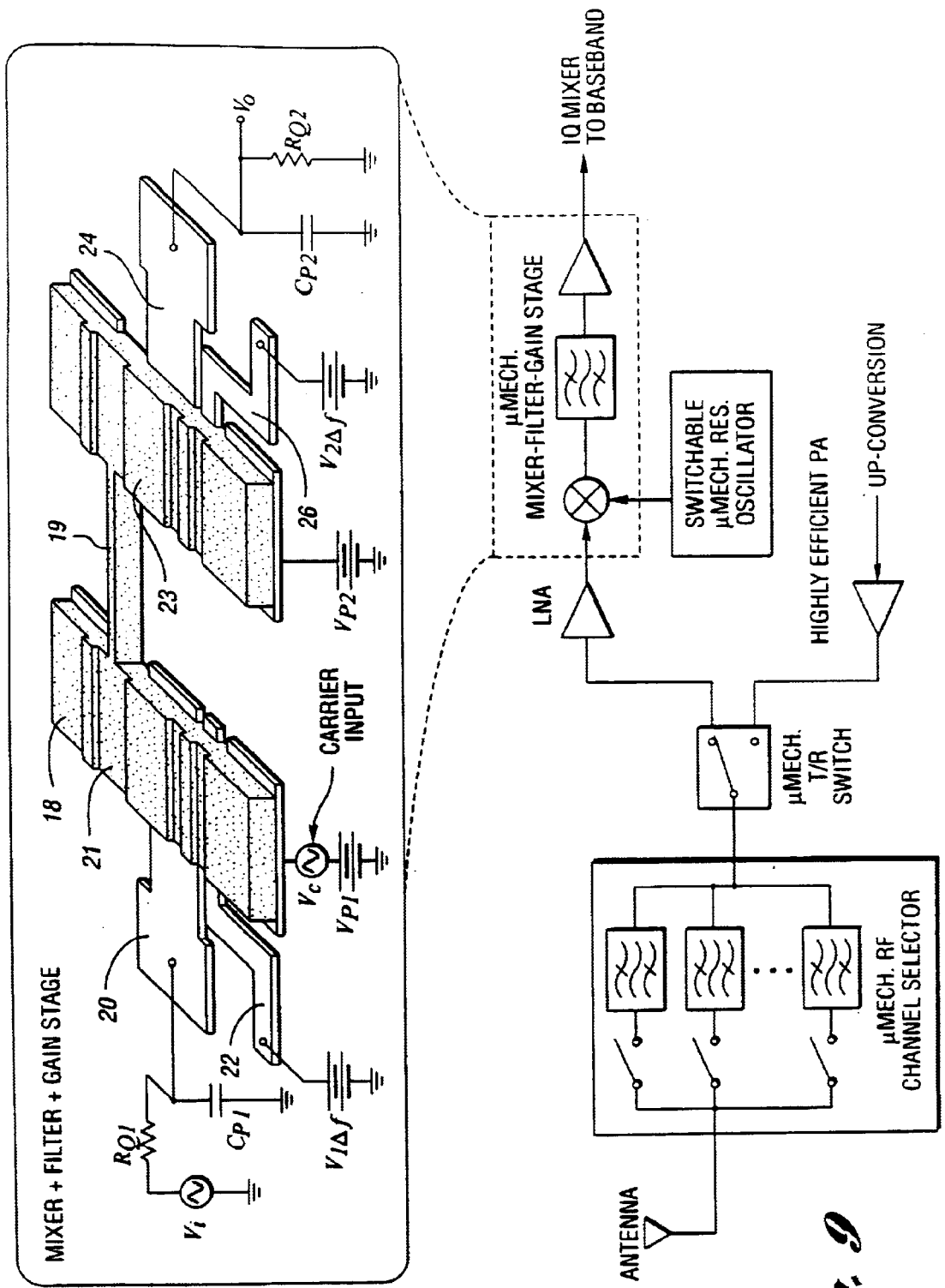
FIG. 9 is a system level block diagram of the RF front-end receiver of FIGS. 6 and 8 and schematically and perspectively illustrating a mixer-filter-gain stage thereof based on the filter of FIGS. 6 and 5*a*.

FIG. 9 presents the schematic for a symmetrical μmechanical mixer-filter, showing the bias and input scheme required for down-conversion with a gain stage. As shown, since this device provides filtering as part of its function, the overall mechanical structure is exactly that of a μmechanical filter. The only differences are the applied inputs and the use of a non-conductive coupling beam to isolate the IF port from the LO. If the source providing $V_P$ to the second resonator is ideal (with zero source resistance) and the series resistance in the second resonator is small, LO signals feeding across the coupling beam capacitance are shunted to AC ground before reaching the IF port. In reality, finite resistivity in the resonator material allows some amount of LO-to-IF leakage.

The mixer conversion gain/loss in this device is determined primarily by the relative magnitudes of the DC-bias $V_P$ applied to the resonator and the local oscillator amplitude $V_{LO}$.

In general, conversion gain is possible if $V_{LO} > V_P$.

Micromechanical Switches

Figure 8:
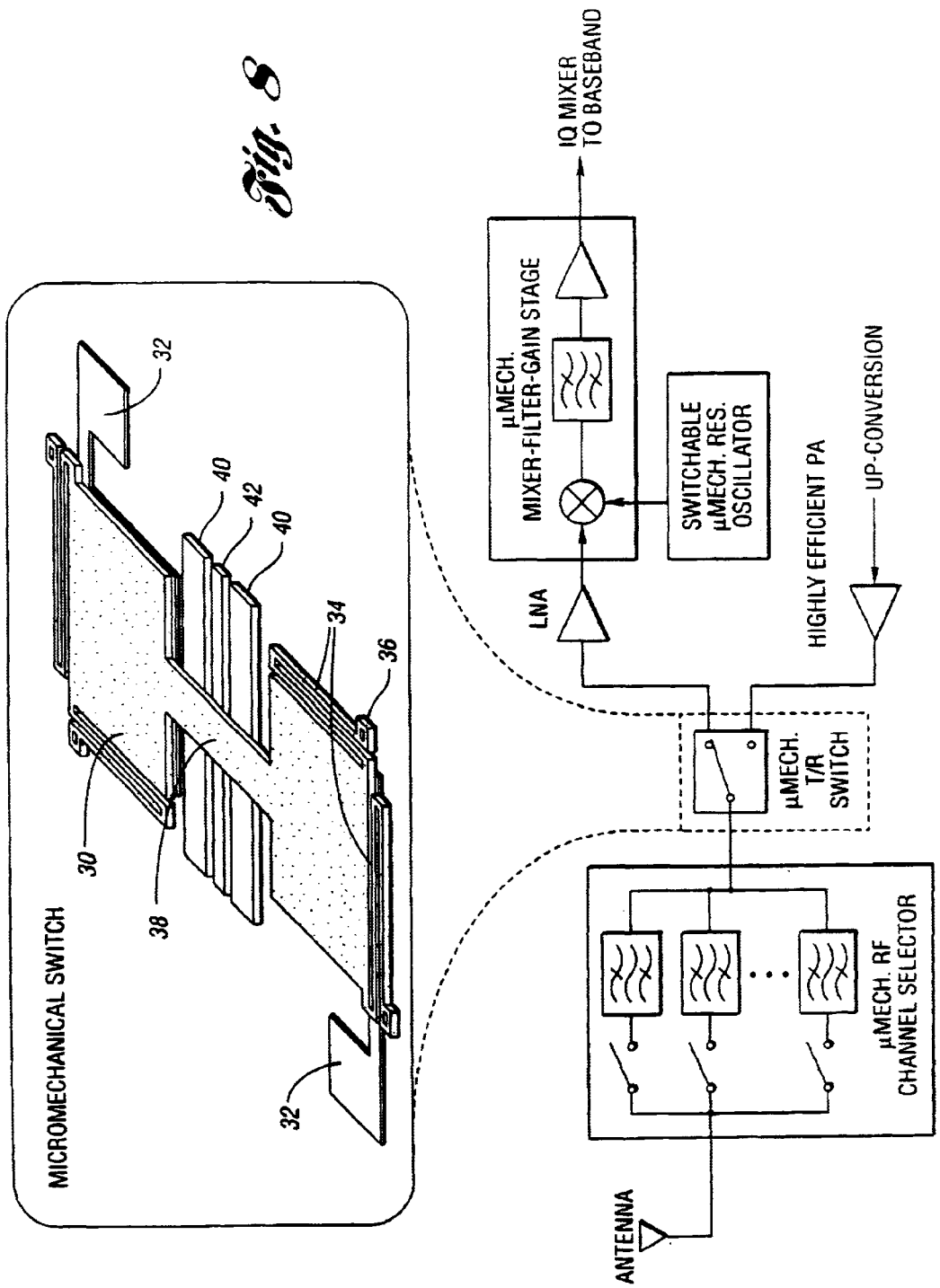
FIG. 8 is a system level block diagram of the RF front-end receiver of FIG. 6 and schematically and perspectively illustrating a micromechanical switch thereof.

The mixer-filter device described above is one example of a μmechanical circuit that harnesses non-linear device properties to provide a useful function. Another very useful mode of operation that further utilizes the non-linear nature of the device is a μmechanical switch. FIG. 8 presents an operational schematic for a μmechanical switch. A conductive or actuation plate 30 is suspended above a pair of actuation electrodes 32 by suspension beams 34 having anchors 36. A switch conductor portion 38 of the plate 30 is suspended over a pair of grounds 40 and a sense electrode or conductor 42. When the switch is in the "on-state" here, the conductor 42 is shorted to the grounds 40. The operation of the switch of FIG. 8 is fairly simple: To achieve the "on-state" for one of the electrodes apply a sufficiently large voltage across the plate and a desired electrode to pull that part of the plate down and short it (in either a DC or AC fashion) to the desired electrode.

In general, to minimize insertion loss, the majority of switches use metals as their structural materials. It is their metal construction that makes μmechanical switches so attractive, allowing them to achieve "on-state" insertion losses down to 0.1 dB—much lower than FET transistor counterparts, which normally exhibit ~2 dB of insertion loss. In addition to exhibiting such low insertion loss, μmechanical switches are extremely linear, with IIP3's greater than 66 dBm, and can be designed to consume no DC power (as opposed to FET switches, which sink a finite current when activated).

RF Receiver Front-End Architectures Using MEMS

The methods by which the above-noted mechanical circuits are best incorporated into communications subsystems are now considered. Three approaches to using micromechanical vibrating resonators are described in order of increasing performance enhancement:

1) Direct replacement of off-chip high-Q passives;
2) Use of an RF channel select architecture using a large number of high-Q micromechanical resonators in filter banks and switchable networks; and
3) Use of an all-mechanical RF front-end.

In the RF channel-select architecture, μmechanical circuits are assumed to be able to operate at UHF with Q's on the order of 10,000. However, this isn't absolutely necessary. It is needed for today's communications, but in the future, a communications standard may come about that allows even less Q.

Direct Replacement of Off-Chip High-Q Passives

Perhaps the most direct way to harness μmechanical circuits is via direct replacement of the off-chip ceramic, SAW, and crystal resonators used in RF preselect and image reject filters, IF channel-select filters, and crystal oscillator references, as illustrated in FIGS. 1 and 3. In addition to high-Q components, FIG. 3 also shows the use of other MEMS-based passive components, such as medium-Q micromachined inductors and tunable capacitors used in VCO's and matching networks, as well as low-loss (~0.1 dB) μmechanical switches that not only provide enhanced antenna diversity, but that can also yield power savings by making TDD (rather than FDD) more practical in future transceivers.

Of course, the main benefits from the above approach to using MEMS are size reduction and, given the potential for integration of MEMS with transistor circuits, the ability to move more components onto the silicon die. A limited number of performance benefits also result from replacement of existing high-Q passives by μmechanical ones, such as the ability to tailor the termination impedances required by RF and IF filters (c.f., Table 2). Such impedance flexibility can be beneficial when designing low-noise amplifiers (LNA's) and mixers in CMOS technology, which presently often consume additional power to impedance match their outputs to 50Ω off-chip components. If higher impedances can be used, for example at the output of an LNA, significant power savings are possible. As an additional benefit, since the source impedance presented to the LNA input is now equal to $R_Q$, it can now be tailored to minimize noise figure (NF).

Although beneficial, the performance gains afforded by mere direct replacement by MEMS are quite limited when compared to more aggressive uses of MEMS technology. More aggressive architectures are described hereinbelow.

An RF Channel-Select Architecture

To fully harness the advantages of μmechanical circuits, one must first recognize that due to their micro-scale size and zero DC power consumption, μmechanical circuits offer the same system complexity advantages over off-chip discrete components that planar IC circuits offer over discrete transistor circuits. Thus, to maximize performance gains, μmechanical circuits should be utilized on a massive scale, or at least as much as possible.

Perhaps one of the simplest ways to harness the small size of micromechanical circuits is to add multi-band reconfigurability to a transceiver by adding a preselect and image reject filter for each communication standard included. Due to the small size of micromechanical filters, this can be done with little regard to the overall size of the transceiver.

Figure 6:
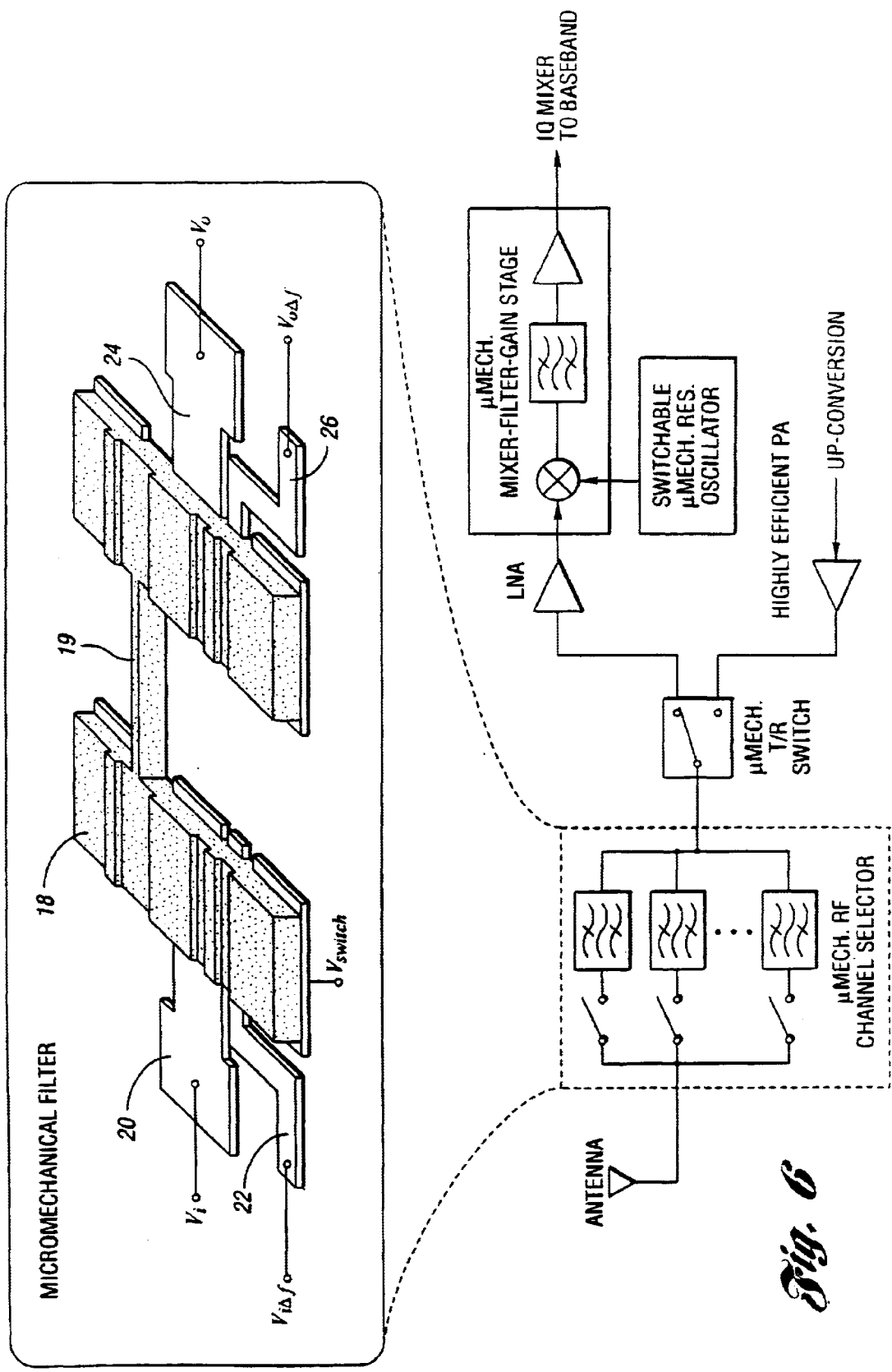

Although the above already greatly enhances the capability of today's wireless transceivers, it in fact only touches upon a much greater potential for performance enhancement. In particular, it does not utilize micromechanical circuits to their fullest complexity. FIG. 6 presents the system-level block diagram for a possible receiver front-end architecture that takes full advantage of the complexity achievable via μmechanical circuits, such as the micromechanical filter of FIG. 5a. The main driving force behind this architecture is power reduction, attained in several of the blocks by trading power for high selectivity (i.e., high-Q). The key power saving blocks in FIG. 6 are now described.

Switchable RF Channel-Select Filter Bank

If channel selection (rather than pre-selection) were possible at RF frequencies (rather than just an IF), then succeeding electronic blocks in the receive path (e.g., LNA, mixer) would no longer need to handle the power of alternate channel interferers. Thus, their dynamic range can be greatly relaxed, allowing substantial power reductions. In addition, the rejection of adjacent channel interferers also allows reductions in the phase noise requirements of local oscillator (LO) synthesizers, providing further power savings.

To date, RF channel selection has been difficult to realize via present-day technologies. In particular, low-loss channel selection at RF would require tunable resonators with Q's in the thousands. Unfortunately, however, high-Q often precludes tunability, making RF channel selection via a single RF filter a very difficult prospect.

On the other hand, it is still possible to select individual RF channels via many non-tunable, or slightly tunable, high-Q filters, one for each channel, and each switchable (and tunable) by command. Depending upon the standard, this could entail hundreds or thousands of filters—numbers that would be absurd if off-chip macroscopic filters are used, but that may be perfectly reasonable for microscale, passive, μmechanical filters, such as previously described.

FIG. 7 presents one fairly simple rendition of the key system block that realizes the desired RF channel selection. As shown, this block consists of a bank of μmechanical filters with all filter inputs connected to a common block input and all outputs to a common block output, and where each filter passband corresponds to a single channel in the standard of interest. However, it is to be noted that it does not have to be limited to a single channel. It could also be several channels as well (e.g., 3 channels) and this could still be very advantageous, depending upon the communications standard.

In the scheme of FIG. 7, a given filter is switched on (with all others off) by decoder-controlled application of an appropriate DC-bias voltage to the desired filter. The desired force input and output current are generated in a μmechanical resonator only when a DC-bias $V_P$ is applied (i.e., without $V_P$, the input and output electrodes are effectively open-circuited).

The potential benefits afforded by this RF channel selector can be quantified by assessing its impact on the LNA linearity specification imposed by the IS-98-A interim standard for CDMA cellular mobile stations. In this standard, the required IIP3 of the LNA is set mainly to avoid desensitization in the presence of a single tone (generated by AMPS) spaced 900 kHz away from the CDMA signal center frequency. Here, reciprocal mixing of the local oscillator phase noise with the 900 kHz offset single tone and cross-modulation of the single tone with leaked transmitter power outputs dictate that the LNA IIP3 exceeds +7.6 dBm. However, if an RF channel-select filter bank such as shown in FIG. 7 precedes the LNA and is able to reject the single tone by 40 dB, the requirement on the LNA then relaxes to IIP3≦−29.3 dBm (assuming the phase noise specification of the local oscillator is not also relaxed). Given the well known noise and linearity versus power trade-offs available in LNA design, such a relaxation in IIP3 can result in nearly an order of magnitude reduction in power. In addition, since RF channel selection relaxes the overall receiver linearity requirements, it may become possible to put more gain in the LNA to suppress noise figure (NF) contributions from later stages, while relaxing the required NF of the LNA itself, leading to further power savings.

Turning to oscillator power, if the single tone interferer is attenuated to 40 dB, then reciprocal mixing with the local oscillator is also greatly attenuated, allowing substantial reduction in the phase noise requirement of the local oscillator. Requirement reductions can easily be such that on-chip solutions to realization of the receive path VCO (e.g., using spiral inductors and pn-diode tunable capacitors) become plausible.

Practical implementations of the switchable filter bank require multiplexing support electronics that must interconnect with each μmechanical device. If implemented using a two-chip approach, the number of chip-to-chip bonds required could become quite cumbersome, making a single-chip solution desirable.

In the pursuit of single-chip systems, several technologies that merge micromachining processes with those for integrated circuits have been developed and implemented over the past several years. These technologies can be categorized into three major approaches: mixed circuit and micromechanics, pre-circuits, and post-circuits. These technologies, however, are well known in the art and are not discussed herein.

Switchable Micromechanical Resonator Synthesizer

Although the μmechanical RF channel selector described above with reference to FIGS. 5, 6 and 7 may make possible the use of existing on-chip technologies to realize the receive path VCO as shown in FIG. 3, this approach is not recommended, since it denies the system from achieving much greater power reduction factors that may soon be available through MEMS technology. In particular, given that power and Q can often be interchanged when designing for a given oscillator phase noise specification, a better approach to implementing the VCO would be to use μmechanical resonators (with orders of magnitude higher Q than any other on-chip tank) to set the VCO frequency. In fact, with Q's as high as achievable via μmechanics, the basic design methodologies for oscillators must be re-evaluated. For example, in the case where the oscillator and its output buffer contribute phase noise according to Leeson's equation, where the $1/f^2$-to-white phase noise corner occurs at $(f_o/(2Q))$, a tank Q>1,500 is all that would be required to move the $1/f^2$-to-white phase noise corner close enough to the carrier that only white phase noise need be considered for CDMA cellular applications, where the phase noise power at frequency offsets from 285 kHz to 1515 kHz is most important. If only white noise is important, then only the output buffer noise need be minimized, and sustaining amplifier noise may not even be an issue. If so, the power requirement in the sustaining amplifier might be dictated solely by loop gain needs (rather than by phase noise needs), which for a μmechanical resonator-based VCO with $R_x$~40Ω, $L_x$~84 μH, and $C_x$~0.5 fF, might be less than 1 mW.

Figure 10:
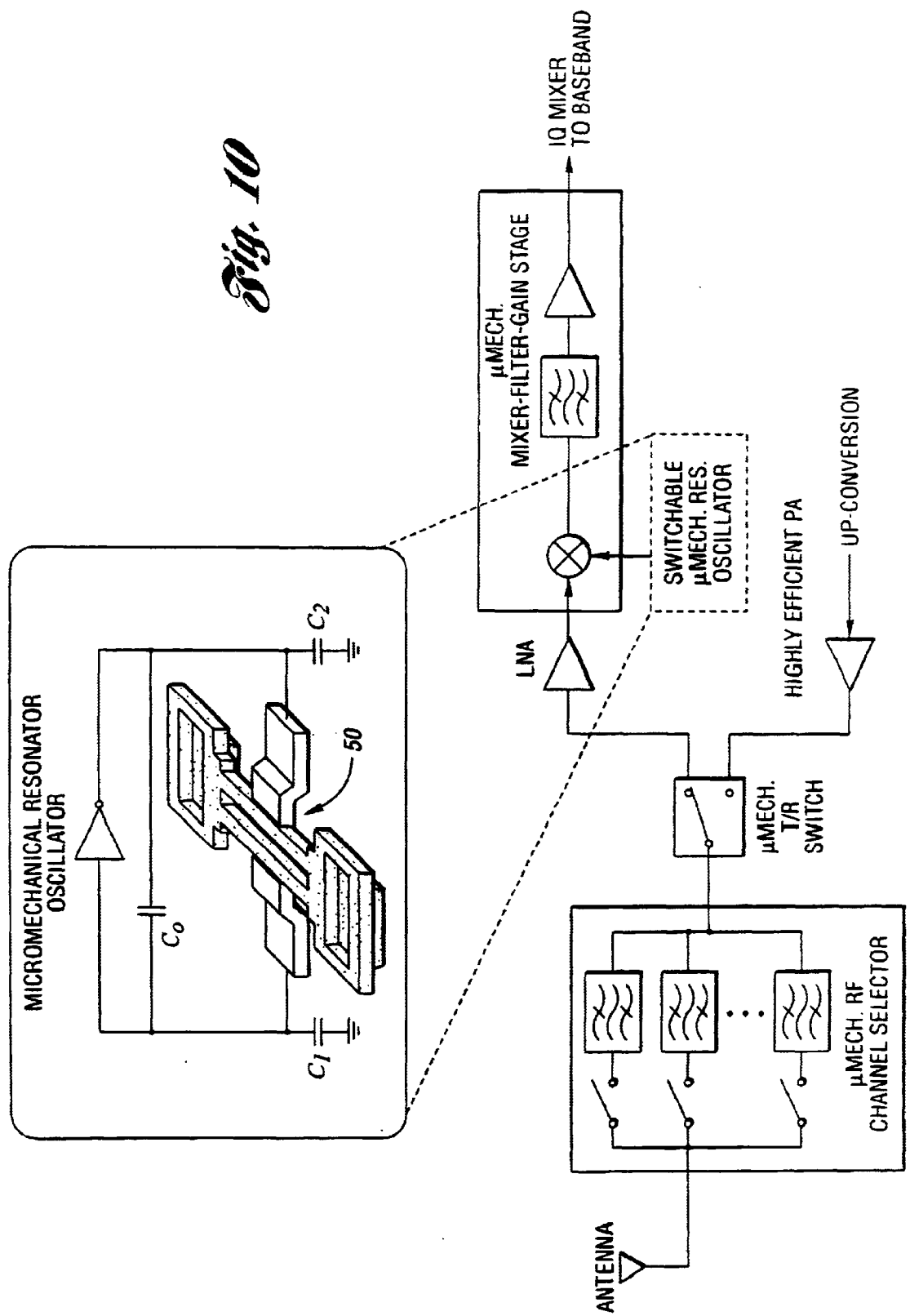
FIG. 10 is a system level block diagram of the RF front-end receiver of FIGS. 6, 8 and 9 and schematically and perspectively illustrating a micromechanical resonator oscillator thereof.
Figure 11:
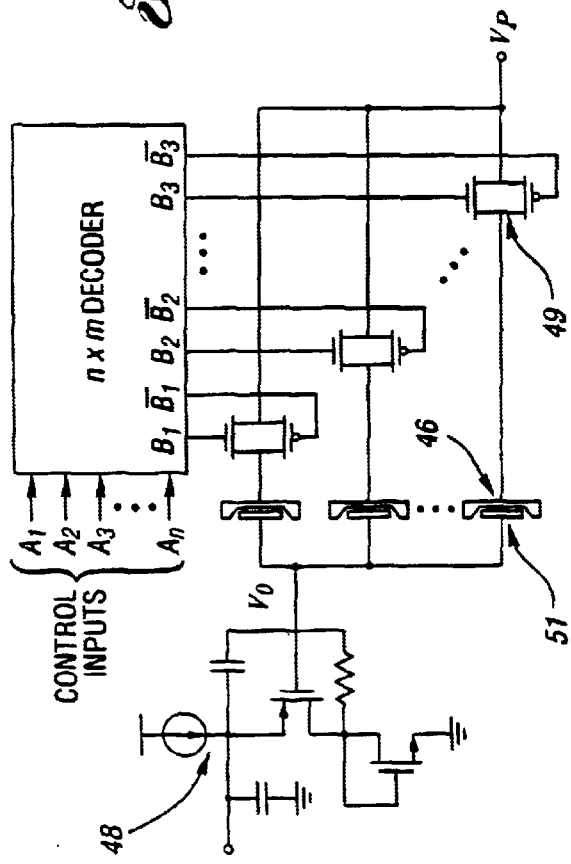
FIG. 11 is a system/circuit diagram for a switchable μmechanical resonator synthesizer.

To implement a tunable local oscillator synthesizer, a switchable bank, similar to that of FIG. 7 but using μmechanical resonators 46, not filters, each corresponding to one of the needed LO frequencies, and each switchable into or out of an oscillator sustaining circuit 48 by transistor switches 49 at their electrodes 51 is illustrated in FIG. 11 and is preferred over the tuning-fork-resonator oscillator 50 illustrated in FIG. 10. Because μmechanical resonators are now used in this implementation, the Q and thermal stability of the oscillator may now be sufficient to operate without the need for locking to a lower frequency crystal reference. The power savings attained upon removing the PLL and prescaler electronics needed in past synthesizers can obviously be quite substantial. In effect, by implementing the synthesizer using μmechanical resonators, synthesizer power consumption can be reduced from the ~90 mW dissipated by present-day implementations using medium-Q L and C components, to something in the range of only 1–4 mW. Again, all this is attained using a circuit topology that would seem absurd if only macroscopic high-Q resonators were available, but that becomes plausible in the micromechanical arena.

FIG. 11 presents the basic topology of the LO synthesizer. Here, rather than tune a single medium Q resonator such as done in present-day VCO's, a bank of numerous switchable high-Q (Q>5,000) micromechanical resonators is utilized, where each resonator corresponds to one of the needed frequencies in a given communications network. In this scheme, no phase-locking circuit is required, since the local oscillator merely switches the appropriate resonator into the oscillator feedback loop to generate the needed output frequency. Because the Q of the micromechanical resonators are orders of magnitude higher than before (Q~5,000, as opposed to 40), the phase noise performance of this oscillator should be orders of magnitude better than present-day VCO's. In fact, with such a high Q, the $1/f^2$-to-white noise corner frequency of the standard phase noise vs. frequency plot may be so close to the carrier, that $1/f^2$ noise may no longer be a major consideration, and only white noise is present at the important frequency offsets. In this case, power could be traded for Q to such an extent that it may become possible to operate the oscillator with less than 1 mW of power consumption. Combined with the fact that phase-locking is no longer required in the scheme of FIG. 11, this constitutes more than 90 mW of power savings, while improving the performance of the oscillator.

It should be emphasized that the oscillator scheme of FIG. 11 would be difficult to practically realize without MEMS technology—in particular, without its ability to attain Q's>5, 000 in such a tiny size. Specifically, present-day LO synthesizers are constrained to use low-Q tanks in their VCO's because such tanks are much more tunable than their high-Q counterparts; i.e., high-Q generally implies low tunability. Thus, to attain tunability using high-Q resonators, many resonators are required, one for each frequency to be generated. This, of course, would require an absurdly large volume if macroscopic high-Q components are utilized. With μmechanical high-Q elements, however, hundreds or even thousands of resonators can fit within a 0.5×0.5 cm² area, so the synthesizer architecture of FIG. 11 becomes plausible.

A single-chip LO synthesizer, using the architecture of FIG. 11 can achieve impressive phase noise performance at UHF frequencies (~800 MHz). By using higher-mode, free-free beam resonator designs previously described, UHF (and possibly S-Band or higher) frequency synthesizers are feasible. K- or Ka-Band applications are not unreasonable, and should benefit from the architecture of FIG. 11 either directly as shown, or indirectly, since a UHF high-Q reference oscillator should greatly improve the stability of K- or Ka-band synthesizers.

Micromechanical Mixer-Filter

The use of a μmechanical mixer-filter in the receive path as illustrated in FIG. 9 eliminates the DC power consumption associated with the active mixer normally used in present-day receive architectures. The mixer-filter-gain stage includes a pair of n-type resonators 21, 23 coupled together by a p-type or undoped beam or spring 19 similar to filters of FIGS. 5a and 6.

This corresponds to a power savings on the order of 10–20- mW. In addition, if multiple input electrodes (one for RF, one for matching) are used for the mixer-filter, the RF input can be made to appear purely capacitive to the LNA (i.e., at the RF frequency), and the LNA would no longer require a driver stage to match a certain impedance. Rather, an inductive load can be used to resonate the capacitance, allowing power savings similar to that previously discussed in association with impedance matching.

An All-MEMS RF Front-End Receiver Architecture

Figure 12:
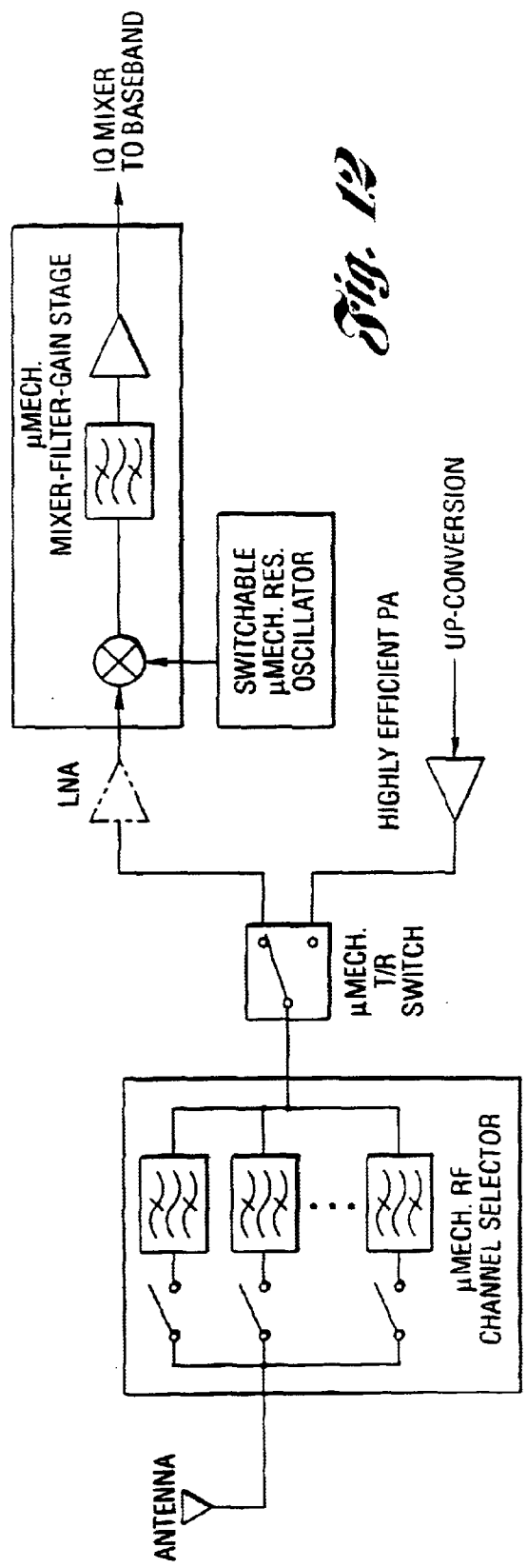
FIG. 12 is a system level block diagram of the RF front-end receiver of FIGS. 6, 8, 9 and 10 wherein the LNA is shown eliminated by phantom lines due to the low loss channel selector, the T/R switch and the mixer-filter-gain stage.
Figure 13:
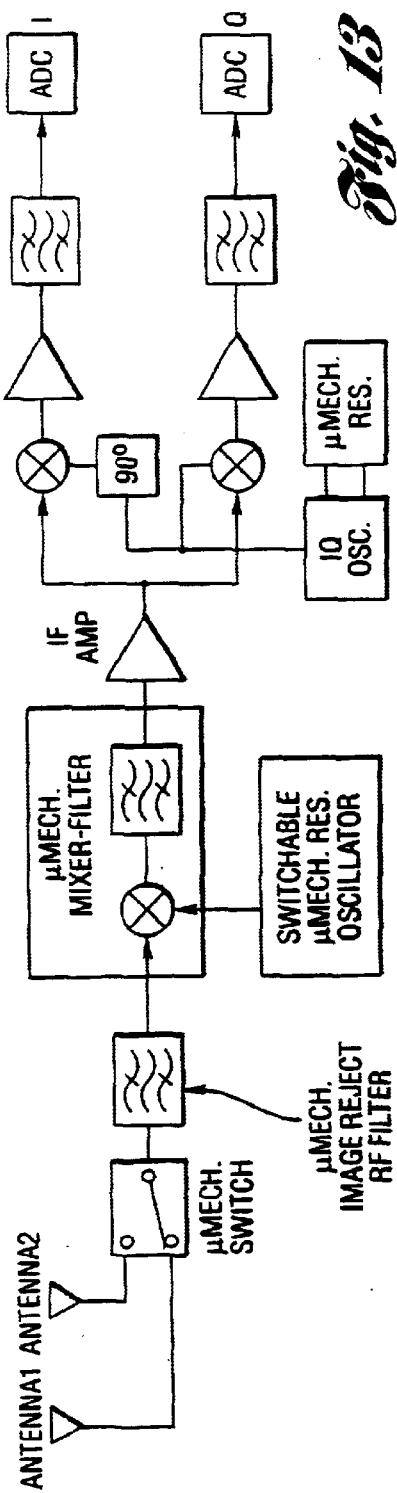
FIG. 13 is a system block diagram architecture showing the receive path of a communication device.

In the above MEMS-based architecture, if μmechanical filters and mixer-filters can post insertion losses consistent with their high-Q characteristics, then an LNA is not really required at RF frequencies, as illustrated by phantom lines for the LNA in FIG. 12. FIG. 13 depicts a receive path comprised of a relatively wideband image reject µmechanical RF filter followed immediately by a narrowband IF mixer-filter that then feeds subsequent IF electronics. The only active electronics operating at RF in this system are those associated with the local oscillator, which if it uses a bank of µmechanical resonators as previously described, may be able to operate at less than 1 mW. The architecture of FIG. 13 clearly presents enormous power advantages, eliminating completely the power consumption of the LNA and active mixer of FIG. 3—a total power savings on the order of 40 mW—and together with the 90 mW of power savings from the micromechanical LO, substantially increasing mobile phone standby times.

An RF Transmitter Architecture Using MEMS

Due to a lack of sufficient in-band power handling capability, very little consideration has been given to date to the possibility of using µmechanical resonators in the transmit path.

Figure 14:
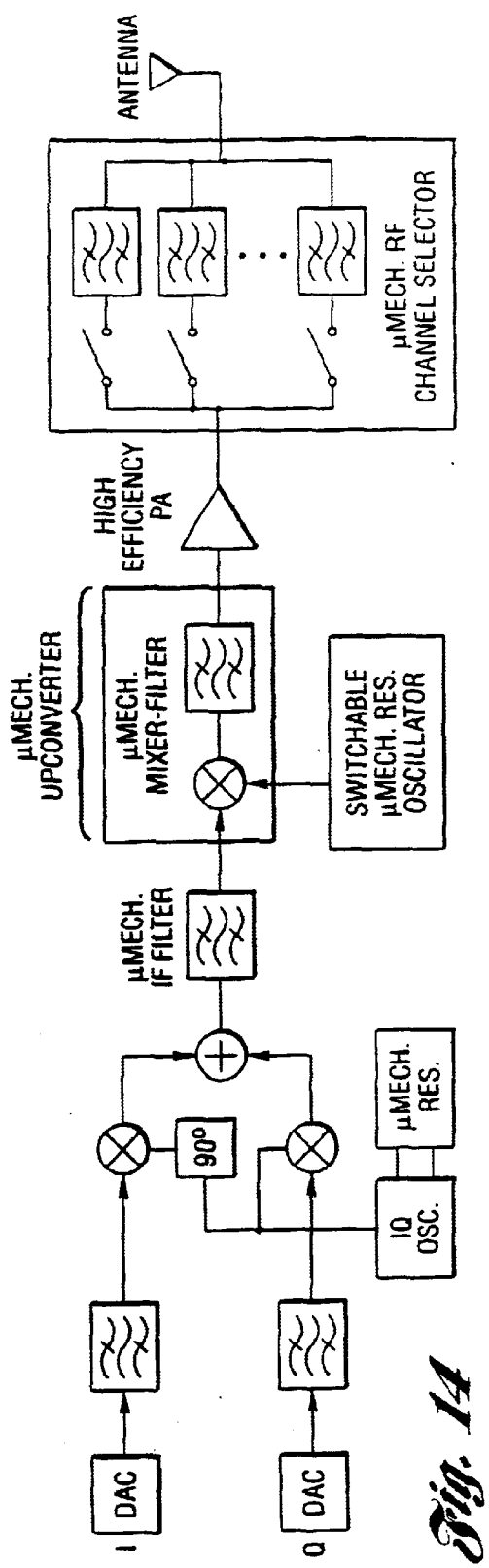
FIG. 14 is a system block diagram of an RF channel-select transmitter architecture utilizing high-power μmechanical resonators.

FIG. 14 depicts one rendition, in which an RF channel selector is placed after the power amplifier (PA) in the transmit path. This channel selector uses a similar circuit as that of FIG. 7, but using µmechanical resonators with sufficient power handling capability. This transmit topology provides enormous power savings. In particular, the high-Q, high-power filter with less than 1 dB of insertion loss follows the PA, cleaning all spurious outputs, including those arising from spectral regrowth. Consequently, more efficient PA designs can be utilized, despite their non-linearity. For example, a PA previously restricted by linearity considerations to 30% efficiency in present-day transmitter architectures, may now be operable closer to its maximum efficiency, perhaps 50%. For a typical transmit power of 600 mW, this efficiency increase corresponds to 800 mW of power savings. If a more efficient PA topology could be used, such as Class E, with theoretical efficiencies approaching 100%, the power savings could be much larger.

In addition to the MEMS-based channel-select RF filter bank, the architecture of FIG. 14 also features a micromechanical upconverter that uses a mixer-filter device, such as previously described, to upconvert and filter the information signal before directing it to the power amplifier.

There are two preferred methods for using the structure of the upper part of FIG. 9 as an upconverting device. In the first method, the baseband signal at frequency $\omega_{IF}$ to be upconverted is applied to the input electrode 20 and the upconverting carrier signal at frequency $\omega_{LO}$ is applied to the input resonator device 21. Upconversion occurs through mixing around the nonlinear capacitive transducer between the input electrode 20 and the resonator 21. Specifically, the electrical baseband information signal at frequency $\omega_{IF}$ is upconverted to a force at frequency $\omega_{LO}+\omega_{IF}$. This force is then filtered by the filter structure of FIG. 9, which is now designed to have a passband around $\omega_{LO}+\omega_{IF}$. If this passband is made small enough, channel selection to the point of removing not only distortion harmonics, but also spectrally regrown components, is possible. By placing a dc-bias $V_P$ on the output resonator 23, the displacement of this resonator is converted to an electrical output voltage or current, depending upon the output load. It should be noted, also, that gain is possible in upconverting the baseband signal to the RF signal, so this stage also serves as a gain stage, as well.

The second method for upconversion, involves filtering the based band signal first, then upconverting. In this method, the baseband signal is again applied to the input electrode 20, but the dc-bias is applied to the input resonator, and the carrier signal to the output resonator. This way, the baseband signal is first filtered by the structure, then upconverted at the output via electromechanical amplitude modulation. Again, gain is possible in this configuration.

High power handling micromechanical resonators may use alternative geometries (e.g., no longer flexural mode) and the use of alternative transduction (e.g., piezoelectric, magnetostrictive).

Summary

Vibrating µmechanical resonators constitute the building blocks for a new integrated mechanical circuit technology in which high Q serves as a principal design parameter that enables more complex circuits. By combining the strengths of integrated µmechanical and transistor circuits, using both in massive quantities, previously unachievable functions become possible that enable transceiver architectures with projections for orders of magnitude performance gains. In particular, with the addition of high-Q µmechanical circuits, paradigm-shifting transceiver architectures that trade power for selectivity (i.e., Q) become possible, with the potential for substantial power savings and multi-band reconfigurability.

While the best mode for carrying out the invention has been described in detail, those familiar with the art to which this invention relates will recognize various alternative designs and embodiments for practicing the invention as defined by the following claims.

What is claimed is:

1. A method for filtering signals to obtain a desired passband of frequencies, the method comprising:
    providing a micromechanical filter apparatus including a micromechanical resonator having a fundamental resonant mode formed on a substrate and a support structure anchored to the substrate to support the resonator above the substrate; and
    vibrating the resonator so that the apparatus passes a desired frequency range of signals while substantially attenuating signals outside the desired frequency range, wherein the support structure is attached to the resonator and the support structure and the resonator are both dimensioned so that the resonator is isolated from the support structure during resonator vibration, wherein energy losses to the substrate are substantially eliminated and wherein the apparatus is a high-Q apparatus.

2. The method as claimed in claim 1 wherein the step of vibrating includes forcing different portions of the resonator to move in opposite directions at the same time so that the resonator vibrates in a resonant mode, m, higher than the fundamental resonant mode wherein the resonator has m+1 nodal points.

3. The method as claimed in claim 2 wherein the micromechanical filter apparatus includes a plurality of input electrodes spaced along the resonator to allow electrostatic excitation of the resonator and wherein the step of forcing includes the steps of applying an in-phase signal to one of the input electrodes to deflect a first portion of the resonator in a first direction and applying an out-of-phase signal to another input electrode to deflect a second portion of the resonator in a second direction opposite the first direction to force the resonator into a correct mode shape.

4. The method as claimed in claim 2 wherein the micromechanical filter apparatus includes an input electrode formed on the substrate to allow electrostatic excitation of the resonator and wherein the step of forcing includes the step of applying a signal to the input electrode, the resonator and the input electrode defines a capacitive transducer gap therebetween and wherein the micromechanical resonator further includes m+1 spacers having a height and which extend between the resonator and the substrate at the m+1 nodal points and wherein the m+1 spacers force the resonator into a correct mode shape during the application of the signal to the input electrode.

5. A micromechanical filter apparatus for filtering signals to obtain a desired passband of frequencies, the apparatus comprising:
a substrate;
a first micromechanical resonator; and
a support structure anchored to the substrate to support the resonator above the substrate wherein the support structure and the resonator are both dimensioned so that the resonator is isolated from the support structure during resonator vibration wherein energy losses to the substrate are substantially eliminated and wherein the apparatus is a high-Q apparatus.

6. The apparatus as claimed in claim 5 wherein the support structure is attached to the resonator at at least one nodal point of the resonator.

7. The apparatus as claimed in claim 5 wherein the signals are RF signals.

8. The apparatus as claimed in claim 7 wherein the apparatus is an RF filter apparatus.

9. The apparatus as claimed in claim 5 wherein the apparatus is a bandpass filter apparatus.

10. The apparatus as claimed in claim 5 wherein the support structure includes at least one beam attached to a nodal point of the resonator.

11. The apparatus as claimed in claim 5 further comprising at least one input electrode formed on the substrate to allow electrostatic excitation of the resonator wherein the resonator and the at least one input electrode define a capacitive transducer gap therebetween.

12. The apparatus as claimed in claim 11 further comprising at least one spacer having a height, each spacer extending between the resonator and the substrate at a nodal point of the resonator wherein the size of the gap is based on the height of the at least one spacer during pull down of the resonator.

13. The apparatus as claimed in claim 5 wherein the resonator is a silicon-based resonator.

14. The apparatus as claimed in claim 5 wherein the resonator is a diamond-based resonator.

15. The apparatus as claimed in claim 11 further comprising at least one output electrode formed on the substrate to sense output of the apparatus.

16. The apparatus as claimed in claim 5 wherein the support structure includes a plurality of beams and the resonator includes a plurality of nodal points and wherein each of the beams is attached to the resonator at one of the nodal points of the resonator so that the resonator sees substantially no resistance to transverse or torsional motion from the support structure.

17. The apparatus as claimed in claim 11 wherein a pair of balanced input electrodes are formed on the substrate to allow electrostatic excitation of the resonator.

18. The apparatus as claimed in claim 15 wherein a pair of balanced output electrodes are formed on the substrate to sense output of the apparatus.

19. The apparatus as claimed in claim 5 further comprising a second micromechanical resonator, the first and second resonators forming a pair of intercoupled end resonators.

20. The apparatus as claimed in claim 19 wherein the support structure supports the end resonators above the substrate.

21. The apparatus as claimed in claim 19 further comprising an inner resonator intercoupled to the end resonators.

22. The apparatus as claimed in claim 21 wherein the support structure supports the end and inner resonators above the substrate.

23. The apparatus as claimed in claim 21 further comprising a plurality of coupling links for coupling the inner resonator to the end resonators.

24. The apparatus as claimed in claim 23 wherein the coupling links are operable in multiple modes.

25. The apparatus as claimed in claim 23 wherein the coupling links are higher mode coupling beams.

26. The method as claimed in claim 1 wherein the resonator has a Q greater than 5000.

27. The apparatus as claimed in claim 5 wherein the resonator has a Q greater than 5000.

28. A micromechanical filter apparatus for filtering signals to obtain a desired passband of frequencies, the apparatus comprising:
a substrate;
a plurality of intercoupled micromechanical elements capable of resonant vibration; and
a support structure anchored to the substrate to support the elements above the substrate wherein the support structure and the elements are attached at one or more locations sustaining substantially no translational movement during resonant vibration of the elements.

29. The apparatus as claimed in claim 28 wherein the plurality of intercoupled micromechanical elements comprises a first resonant beam and a second resonant beam, wherein the support structure comprises a first support beam and a second support beam attached to the first resonant beam and the second resonant beam, respectively, and wherein the first and second support beams sustain substantially no translational movement during resonant vibration of the elements.

30. The apparatus as claimed in claim 29 wherein the plurality of intercoupled micromechanical elements comprises a third resonant beam coupled to the first resonant beam and the second resonant beam via a pair of coupling beams.

31. A micromechanical filter apparatus for filtering signals to obtain a desired passband of frequencies, the apparatus comprising:
a substrate;
a plurality of intercoupled micromechanical elements capable of resonant vibration; and
a support structure anchored to the substrate to support the elements above the substrate wherein the support structure comprises a support beam, and wherein the support beam is attached to the elements such that the support beam sustains substantially no translational movement during resonant vibration of the elements.

32. The apparatus as claimed in claim 31 wherein the plurality of intercoupled micromechanical elements comprises a first resonant beam, a second resonant beam, and a third resonant beam, and wherein the third resonant beam is coupled to the first resonant beam and the second resonant beam via a pair of coupling beams.

* * * * *